(12) United States Patent
Kim et al.

(10) Patent No.: US 12,740,275 B2
(45) Date of Patent: Sep. 15, 2026

(54) DISPLAY DEVICE

(71) Applicant: Samsung Display Co., Ltd., Yongin-Si (KR)

(72) Inventors: Young Tae Kim, Yongin-si (KR); Hyun Gue Song, Yongin-si (KR); Hyun Ho Jung, Yongin-si (KR); Hee Seong Jeong, Yongin-si (KR); Sun Jin Joo, Yongin-si (KR); Sang Min Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 512 days.

(21) Appl. No.: 18/204,396

(22) Filed: Jun. 1, 2023

(65) Prior Publication Data

US 2024/0122020 A1 Apr. 11, 2024

(30) Foreign Application Priority Data

Oct. 6, 2022 (KR) ........................ 10-2022-0128202
Dec. 20, 2022 (KR) ........................ 10-2022-0179692

(51) Int. Cl.

| | |
|---|---|
| ***H10K 59/179*** | (2023.01) |
| ***H10K 59/122*** | (2023.01) |
| ***H10K 59/35*** | (2023.01) |
| ***H10K 102/00*** | (2023.01) |

(52) U.S. Cl.
CPC ......... *H10K 59/179* (2023.02); *H10K 59/122* (2023.02); *H10K 59/353* (2023.02); *H10K 2102/311* (2023.02)

(58) Field of Classification Search
CPC .. H10K 59/179; H10K 59/122; H10K 59/353; H10K 2102/311; H10K 59/8051; H10K 59/131
See application file for complete search history.

(56) References Cited

U.S. PATENT DOCUMENTS

| | | | | |
|---|---|---|---|---|
| 9,515,290 | B2 | 12/2016 | Lim et al. | |
| 10,811,489 | B2 | 10/2020 | Hong et al. | |
| 11,088,215 | B2 | 8/2021 | Choi | |
| 11,545,533 | B2 | 1/2023 | Bang et al. | |
| 2018/0342570 | A1* | 11/2018 | Hong | H10K 59/353 |
| 2019/0172894 | A1 | 6/2019 | Kim et al. | |

(Continued)

FOREIGN PATENT DOCUMENTS

| | | | |
|---|---|---|---|
| KR | 10-2014-0006581 | A | 1/2014 |
| KR | 10-2020-0133095 | A | 11/2020 |

(Continued)

*Primary Examiner* — Steven B Gauthier
*Assistant Examiner* — Alvin L Lee
(74) *Attorney, Agent, or Firm* — Innovation Counsel LLP

(57) ABSTRACT

Provided is a display device comprising a substrate, a first data line and a second data line disposed on the substrate and extended in a first direction, an anode electrode disposed on the first data line and the second data line, a pixel-defining film disposed over the anode electrode and defining an emission area, an organic light-emitting layer disposed on the anode electrode, and a cathode electrode disposed on the organic light-emitting layer, wherein each of the first data line and the second data line has a curved shape when viewed from a top where the first anode electrode and the second anode electrode overlap the anode electrode.

18 Claims, 22 Drawing Sheets

(56) References Cited

U.S. PATENT DOCUMENTS

| | | | | |
|---|---|---|---|---|
| 2021/0408203 | A1* | 12/2021 | Shi | H10K 59/352 |
| 2022/0130934 | A1 | 4/2022 | Kang et al. | |
| 2022/0310719 | A1* | 9/2022 | Chen | G06F 1/1652 |
| 2022/0320249 | A1 | 10/2022 | Kim et al. | |

FOREIGN PATENT DOCUMENTS

| | | | |
|---|---|---|---|
| KR | 10-2021-0033586 | A | 3/2021 |
| KR | 10-2022-0053728 | A | 5/2022 |
| KR | 10-2022-0058874 | A | 5/2022 |

* cited by examiner

FIG. 1

10
200
DA
NDA
MA
300
100
SBA
DR3
DR2
DR1

FIG. 8

GTL1 : G2, DT_G, G6, CE1
GTL2 : BML2, CE1
GTL3 : GCL
EML : ANE, OL, CAE, PDL

LE : ANE, OL, CAE
DTL1 : BE1, BE2, BE3, BE6, BE8
DTL2 : VDL, ANDE

FIG. 21

DISPLAY DEVICE

CROSS-REFERENCE TO RELATED APPLICATION

This application claims priority from Korean Patent Application Nos. 10-2022-0128202 filed on Oct. 6, 2022 and 10-2022-0179692 filed on Dec. 20, 2022 in the Korean Intellectual Property Office, the disclosure of which is incorporated herein by reference in its entirety.

BACKGROUND

1. Field of the Disclosure

The present disclosure generally relates to a display device. More particularly, the present disclosure relates to a display device capable of improving color mixing by suppressing leakage current, and a method of fabricating the same.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions.

Display devices may be flat panel display devices such as a liquid-crystal display device, a field emission display device, and a light-emitting display device. Light-emitting display devices may include an organic light-emitting display device including an organic light-emitting element, an inorganic light-emitting display device including an inorganic light-emitting element such as an inorganic semiconductor, and a micro-light-emitting display device including an ultra-small light-emitting element.

An organic light-emitting element may include two opposing electrodes and an emissive layer interposed therebetween. Electrons and holes supplied from the two electrodes are recombined in the emissive layer to generate excitons, and the generated excitons relax from the excited state to the ground state so that light can be emitted.

An organic light-emitting display device including organic light-emitting elements requires no separate light source such as a backlight unit, and thus it consumes less power and can be made light and thin, as well as exhibiting high-quality characteristics such as wide viewing angle, high luminance and contrast, and fast response speed. Accordingly, an organic light-emitting display device is attracting attention as the next generation display device.

SUMMARY

Aspects of the present disclosure provide a display device capable of improving color mixing by suppressing leakage current, and a method of fabricating the same.

It should be noted that objects of the present disclosure are not limited to the above-mentioned object; and other objects of the present disclosure will be apparent to those skilled in the art from the following descriptions.

According to an aspect of the present disclosure, a display device comprises a substrate, a first data line and a second data line disposed on the substrate and extended in a first direction, an anode electrode disposed on the first data line and the second data line, a pixel-defining film disposed on the anode electrode and defining an emission area, an organic light-emitting layer disposed on the anode electrode, and a cathode electrode disposed on the organic light-emitting layer, wherein each of the first data line and the second data line has a curved shape when viewed from a top where the first data line and the second data line overlap the anode electrode.

In an embodiment, the first data line and the second data line are adjacent to each other and are symmetrical to each other in the first direction.

In an embodiment, the first data line comprises a first straight portion, a first curved portion connected to the first straight portion, and a first connection portion connected to the first curved portion, and wherein the second data line comprises a second straight portion, a second curved portion connected to the second straight portion, and a second connection portion connected to the second curved portion.

In an embodiment, the first straight portion, the first connection portion, the second straight portion and the second connection portion are extended in the first direction and are formed as straight lines.

In an embodiment, the first straight portion and the second straight portion face each other and are arranged in parallel, and wherein the first connection portion and the second connection portion face each other and are arranged in parallel.

In an embodiment, the first curved portion has a curvature protruding away from the second data line, and wherein the second curved portion has a curvature protruding away from the first data line.

In an embodiment, the first curved portion comprises a first protrusion portion protruding away the second data line, and a first groove portion concave away from the second data line, and wherein the second curved portion comprises a second protrusion portion protruding away the first data line, and a second groove portion concave away from the first data line.

In an embodiment, the first groove portion and the second groove portion face each other and overlap each other in a second direction crossing the first direction when viewed from the top.

In an embodiment, a distance between the first and second straight portion is equal to a distance between the first connection portion and second connection portion.

In an embodiment, a minimum distance between the first curved portion and the second curved portion is equal to a distance between the first straight portion and the second straight portion, and wherein a maximum distance between the first curved portion and the second curved portion is greater than the distance between the first straight portion and the second straight portion.

In an embodiment, a distance between the first curved portion and the second curved portion is variable.

According to an aspect of the present disclosure, a display device comprises a substrate, a first data line and a second data line disposed on the substrate and extended in a first direction, an anode electrode disposed on the first data line and the second data line, a pixel-defining film disposed over the anode electrode and defining an emission area, an organic light-emitting layer disposed on the anode electrode, and a cathode electrode disposed on the organic light-emitting layer, wherein a distance between the first data line and the second data line is variable where the first data line and the second data line overlap the emission area.

In an embodiment, the first data line comprises a first straight portion, a first curved portion connected to the first straight portion, and a first connection portion connected to the first curved portion, and wherein the second data line comprises a second straight portion, a second curved portion connected to the second straight portion, and a second connection portion connected to the second curved portion.

In an embodiment, the first curved portion and the second connection portion overlap each other in a second direction crossing the first direction when viewed from a top, and wherein the second curved portion and the first connection portion overlap each other in the second direction when viewed from the top.

In an embodiment, the first connection portion comprises a first sub-protrusion portion that protrudes toward the second data line, wherein the second connection portion comprises a second sub-protrusion portion that protrudes toward the first data line, and wherein the first sub-protrusion portion and the second sub-protrusion portion do not overlap each other in a second direction crossing the first direction when viewed from a top.

In an embodiment, the first curved portion has a curvature protruding away from the second data line, and wherein the second curved portion has a curvature protruding away from the first data line.

In an embodiment, a distance between the first curved portion and the second curved portion gradually increases and then gradually decreases in the first direction.

According to an aspect of the present disclosure, a display device comprises a substrate, a first data line and a second data line disposed on the substrate and extended in a first direction, a first anode electrode and a second anode electrode disposed on the first data line and the second data line, a pixel-defining film disposed over the first anode electrode and the second anode electrode and defining a first emission area and a second emission area, an organic light-emitting layer disposed on the first anode electrode and the second anode electrode, and a cathode electrode disposed on the organic light-emitting layer, wherein each of the first data line and the second data line has a curved shape when viewed from a top where the first data line and the second data line overlap at least one of the first emission area and the second emission area.

In an embodiment, the first emission area emits different light from the second emission area, and a size of the first emission area is greater than a size of the second emission area.

In an embodiment, the first emission area emits blue light and the second emission area emits red light.

In an embodiment, the first anode electrode and the second anode electrode have elevations formed where the first anode electrode and the second anode electrode overlap the first data line and the second data line.

According to an embodiment of the present disclosure, it is possible to improve the WAD issue, i.e., color coordinate values are different depending on a user's viewing angle by way of adjusting the shapes of data lines overlapping with emission areas.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of the present disclosure will become more apparent by describing in detail embodiments thereof with reference to the attached drawings, in which:

FIG. 1 is a plan view of a display device according to an embodiment of the present disclosure.

FIG. 8 is a cross-sectional view taken along line I-I' of FIG. 7.

FIG. 21 is a plan view illustrating a first data line and a second data line according to another embodiment.

DETAILED DESCRIPTION OF THE EMBODIMENTS

Figure 2:
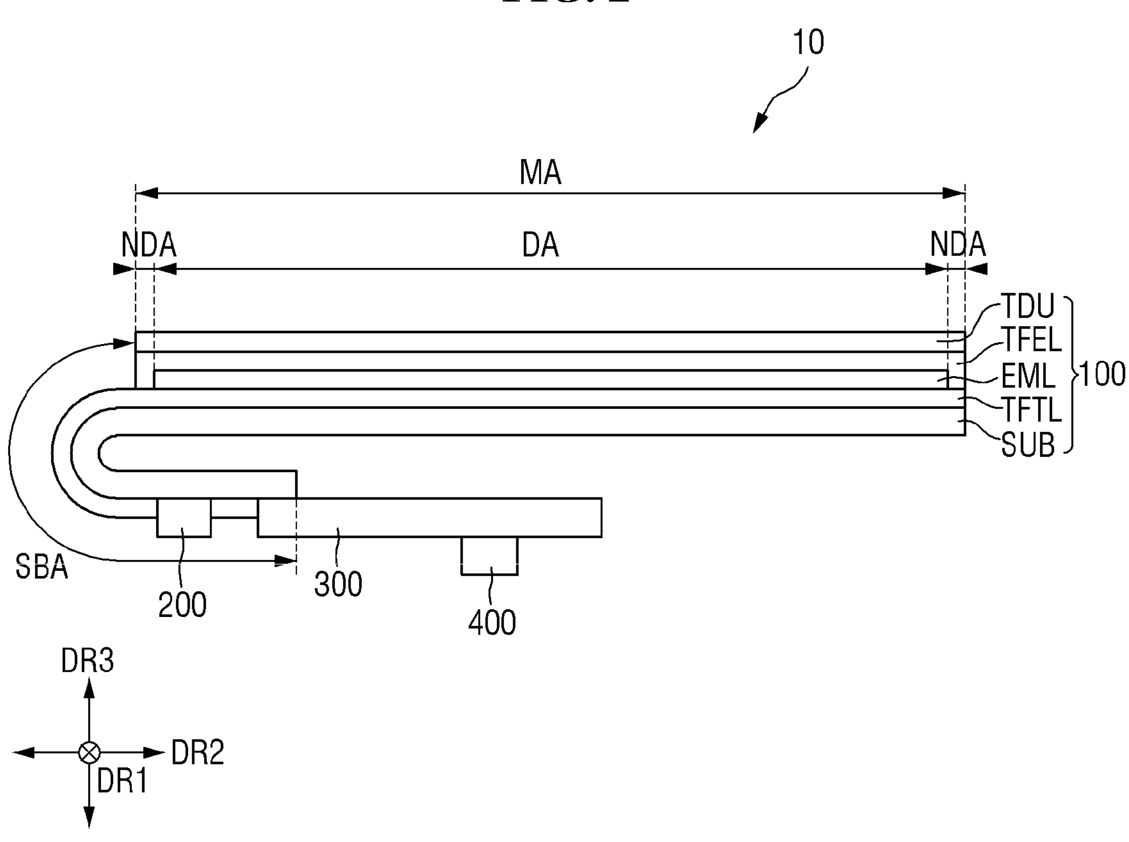
FIG. 2 is a side view illustrating a display device according to an embodiment of the present disclosure.

The present disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments of the present disclosure will be described with reference to the accompanying drawings.

Figure 1:
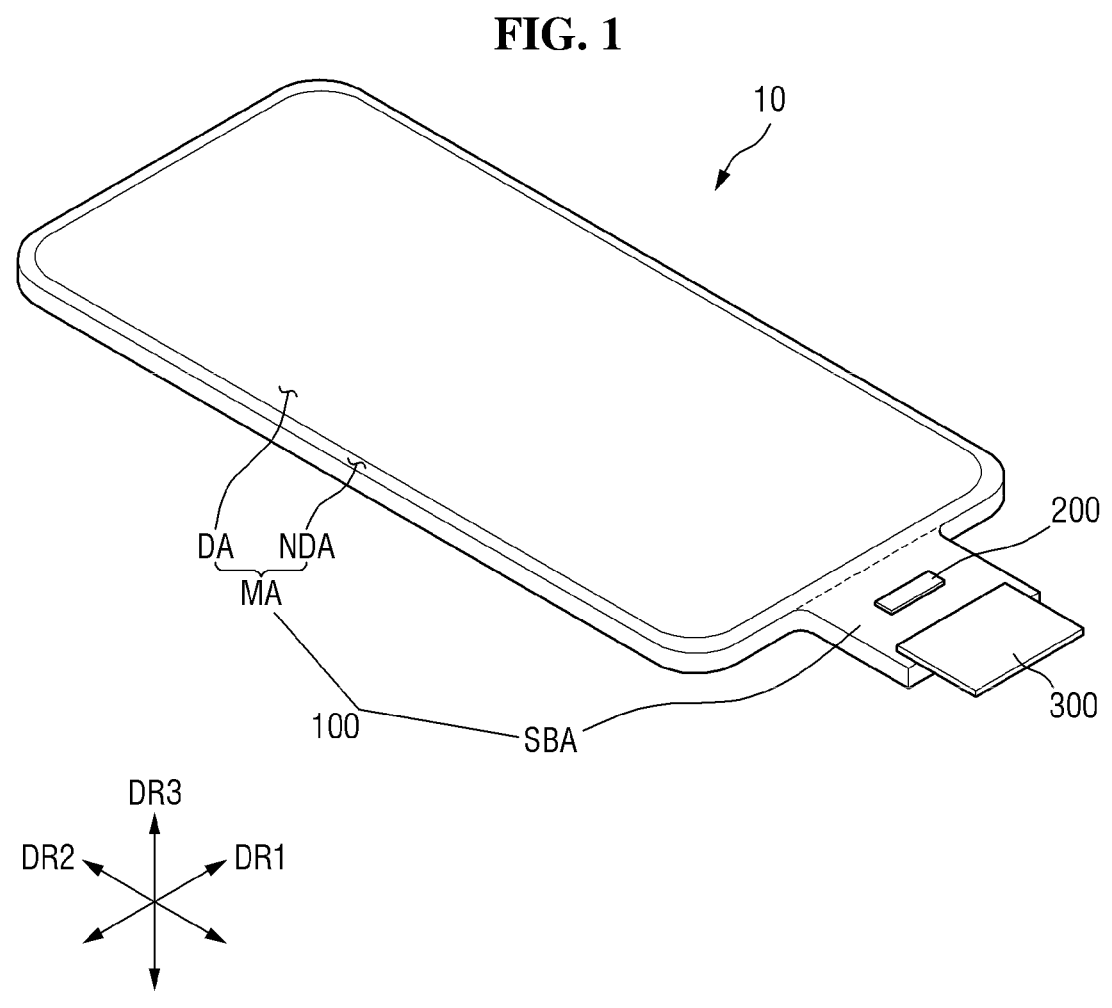

FIG. 1 is a perspective view of a display device according to an embodiment of the present disclosure.

Referring to FIG. 1, a display device 10 is for displaying moving images or still images. The display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and a ultra mobile PC (UMPC), as well as the display screen of various products such as a television, a notebook, a monitor, a billboard and the Internet of Things.

The display device 10 may be a light-emitting display device such as an organic light-emitting display device using organic light-emitting diodes, an inorganic light-emitting display device including an inorganic semiconductor, and a micro light-emitting display device using micro or nano light-emitting diodes (micro LEDs or nano LEDs). In the following description, an organic light-emitting display device is described as an example of the display device 10. It is, however, to be understood that the present disclosure is not limited thereto.

The display device 10 may include a display panel 100, a display driver circuit 200, and a circuit board 300.

The display panel 100 may be formed in a rectangular plane having shorter sides in a first direction DR1 and longer sides in a second direction DR2 intersecting the first direction DR1. Each of the corners where the short side in the first direction DR1 meets the longer side in the second direction DR2 may be rounded with a predetermined curvature or may be a right angle. The shape of the display panel 100 when viewed from the top is not limited to a quadrangular shape, but may be formed in different polygonal shapes such as a circular shape, a square shape, or an elliptical shape. The display panel 100 may be formed flat, but is not limited thereto. For example, the display panel 100 may be formed at left and right ends, and may include a curved portion having a constant curvature or a varying curvature. In addition, the display panel 100 may be flexible so that it can be curved, bent, folded or rolled.

A substrate SUB (see FIG. 1) of the display panel 100 may include a main area MA and a subsidiary area SBA.

The main area MA may include a display area DA where images are displayed, and a non-display area NDA around the display area DA. The display area DA may include sub-pixels SPX (see FIG. 5) for displaying images. The subsidiary area SBA may protrude from one side of the main area MA in the second direction DR2.

Although the subsidiary area SBA is unfolded in the example shown in FIG. 1, the subsidiary area SBA may be bent and may be disposed on the lower surface of the display panel 100. When the subsidiary area SBA is bent, it may overlap the main area MA in a thickness direction of the substrate SUB which is equivalent to the third direction DR3. The display driver circuit 200 may be disposed in the subsidiary area SBA.

The display driver circuit 200 may generate signals and voltages for driving the display panel 100. The display driver circuit 200 may be implemented as an integrated circuit (IC) and may be attached to the display panel 10 by a chip on glass (COG) technique, a chip on plastic (COP) technique, or an ultrasonic bonding. It is, however, to be understood that the present disclosure is not limited thereto. For example, the display driver circuit 200 may be attached on the circuit board 300 by the chip-on-film (COF) technique.

The circuit board 300 may be attached to one end of the subsidiary area SBA of the display panel 100. Accordingly, the circuit board 300 may be electrically connected to the display panel 100 and the display driver circuit 200. The display panel 100 and the display driver circuit 200 may receive digital video data, timing signals, and driving voltages through the circuit board 300. The circuit board 300 may be a flexible printed circuit board, a printed circuit board, or a flexible film such as a chip on film.

FIG. 2 is a side view illustrating a display device according to an embodiment of the present disclosure.

FIG. 2 shows that the subsidiary area SBA is bent such that it is located under the lower surface of the display device 10.

Referring to FIG. 2, the display panel 100 may include the main area MA and the subsidiary area SBA.

The main area MA may include a display area DA where images are displayed, and a non-display area NDA around the display area DA. The display area DA may occupy most of the main area MA. The display area DA may be disposed at the center of the main area MR.

The non-display area NDA may be disposed adjacent to the display area DA. The non-display area NDA may be disposed on the outer side of the display area DA. The non-display area NDA may surround the display area DA. The non-display area NDA may be defined as the border of the display panel 100.

The subsidiary area SBA may protrude from one side of the main area MA in the second direction DR2. The length of the subsidiary area SBA in the second direction DR2 may be smaller than the length of the main area MA in the second direction DR2. The length of the subsidiary area SBA in the first direction DR1 may be substantially less than the length of the main area MA in the first direction DR1 or may be substantially equal to it. However, it is an example, and the lengths of the subsidiary area in the first and second directions may not be limited thereto. The sub-area SBA may be bent and may be disposed under the display panel 100. In this instance, the subsidiary area SBA may overlap the main area MA in a third direction DR3.

The display driver circuit 200 may generate signals and voltages for driving the display panel 100. The display driver circuit 200 may be implemented as an integrated circuit (IC) and may be attached to the display panel 10 by a chip on glass (COG) technique, a chip on plastic (COP) technique, or an ultrasonic bonding. It is, however, to be understood that the present disclosure is not limited thereto. For example, the display driver circuit 200 may be attached on the display circuit board 300 by the chip-on-film (COF) technique.

The display circuit board 300 may be attached to one end of the subsidiary area SBA of the display panel 100. Accordingly, the display circuit board 300 may be electrically connected to the display panel 100 and the display driver circuit 200. The display panel 100 and the display driver circuit 200 may receive digital video data, timing signals, and driving voltages through the display circuit board 300.

The display circuit board 300 may be a flexible printed circuit board, a printed circuit board, or a flexible film such as a chip on film.

The touch driving circuit 400 may be disposed on the display circuit board 300. The touch driver circuit 400 may be implemented as an integrated circuit (IC) and may be attached on the display circuit board 300.

The touch driver circuit 400 may be electrically connected to sensor electrodes of a touch detecting unit TDU of the display panel 100. The touch driver circuit 400 applies driving signals to the sensor electrodes of the touch detecting unit TDU and measures mutual capacitances of the sensor electrodes. The driving signals may have driving pulses. The touch driving circuit 400 can determine whether a user has touched or the presence of nearby object based on the mutual capacitances. A user's touch refers to that an object such as the user's finger or a pen is brought into contact with a surface of the display device 10 disposed on the touch detecting unit TDU. The user's near proximity refers to that an object such as the user's finger and a pen is hovering over a surface of the display device 10.

The display panel 100 may include a thin-film transistor layer TFTL, an emission material layer EML, an encapsulation layer TFEL and the touch detecting unit TDU disposed on the substrate SUB.

The substrate SUB may be made of an insulating material such as a polymer resin. For example, the substrate SUB may be made of polyimide. The substrate SUB may be a flexible substrate that can be bent, folded, or rolled.

The thin-film transistor layer TFTL may be disposed on the substrate SUB. The thin-film transistor layer TFTL may be disposed in the main area MA and the subsidiary area SBA. The thin-film transistor layer TFTL may include thin-film transistors.

The emission material layer EML may be disposed on the thin-film transistor layer TFTL. The emission material layer EML may be disposed in the display area DA of the main area MA. The emission material layer EML may include light-emitting elements disposed in emission areas.

The encapsulation layer TFEL may be disposed on the emission material layer EML. The encapsulation layer TFEL may be disposed in the display area DA and the non-display area NDA of the main area MA. The encapsulation layer TFEL may include at least one inorganic film and at least one organic film for encapsulating the emission material layer.

The touch detecting unit TSU may be disposed on the encapsulation layer TFEL. The touch detecting layer SENL may be disposed in the display area DA and the non-display area NDA of the main area MA. The touch detecting unit TDU may sense a touch of a person or an object using sensor electrodes.

A cover window for protecting the display panel 100 from above may be further disposed on the touch detecting unit TDU. The cover window may be attached on the touch detecting unit TDU by a transparent adhesive member such as an optically clear adhesive (OCA) film and an optically clear resin (OCR). The cover window may be an inorganic material such as glass, or an organic material such as plastic and polymer material.

In addition, in order to prevent deterioration in visibility of images displayed by the display panel 100 when external light is reflected by the display panel 100, an anti-reflection member may be further disposed between the touch detecting unit TDU and the cover window. The anti-reflection member may be a polarizing film. Alternatively, the anti-reflection member may include a light-blocking organic film such as a black matrix and a color filter, or may include a light-blocking organic film such as a black matrix and an anti-reflection organic film.

Figure 3:
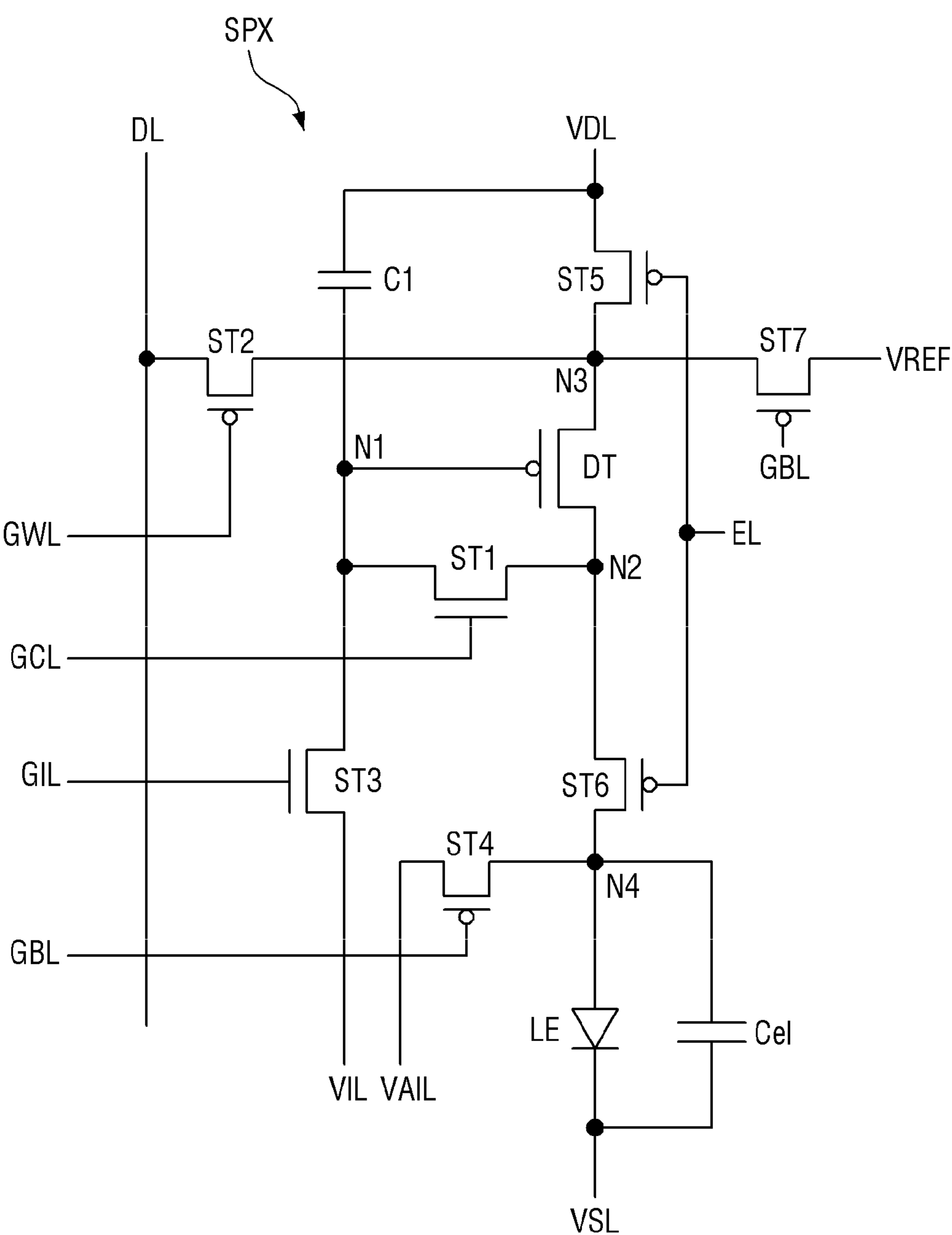
FIG. 3 is a circuit diagram illustrating a sub-pixel of a thin-film transistor layer and an emission material layer according to an embodiment.

FIG. 3 is a circuit diagram illustrating a sub-pixel of a thin-film transistor layer and an emission material layer according to an embodiment.

Referring to FIG. 3, a sub-pixel SPX may be connected to at least one of scan lines GWL, GIL and GCL, one of emission lines EL, and one of data lines. For example, the sub-pixel SPX may be connected to a write scan line GWL, an initialization scan line GIL, a control scan line GCL, an emission line EL, and a data line DL.

The sub-pixel SPX may include a driving transistor DT, switching elements, a capacitor C1, and a light-emitting element LE. The switching elements may include first to seventh transistors ST1, ST2, ST3, ST4, ST5, ST6 and ST7.

The driving transistor DT may include a gate electrode, a first electrode and a second electrode. The drain-source current Ids (hereinafter referred to as "driving current") of driving transistor DT flowing between the first electrode and the second electrode is controlled according to the data voltage applied to the gate electrode.

The light-emitting element LE emits light as the driving current Ids flows therein. The amount of the light emitted from the light-emitting element LE may be proportional to a driving current Ids.

The light-emitting element LE may be an organic light-emitting diode including an anode electrode, a cathode electrode, and an organic emissive layer disposed between the anode electrode and the cathode electrode. Alternatively, the light-emitting element LE may be an inorganic light-emitting element including an anode electrode, a cathode electrode, and an inorganic semiconductor disposed between the anode electrode and the cathode electrode. Alternatively, the light-emitting element LE may be an quantum-dot light-emitting element including an anode electrode, a cathode electrode, and a quantum-dot emissive layer disposed between the anode electrode and the cathode electrode. Alternatively, the light-emitting element LE may be a micro light-emitting diode.

The anode electrode of the light-emitting element LE may be connected to a fourth node N4. The anode electrode of the light-emitting element LE may be connected to the drain electrode of a sixth transistor ST6 and the drain electrode of a fourth transistor ST4 through the fourth node N4. The cathode electrode of the light-emitting element EL may be connected to a low-level voltage line VSL. A parasitic capacitance Cel may be formed between the anode electrode and the cathode electrode of the light-emitting element LE.

The first transistor ST1 may be turned on by a scan signal of a write scan line GWL to connect a second node N2, i.e., the drain electrode of the driving transistor DT with the first node N1, i.e., the gate electrode of the driving transistor DT. The gate electrode of the first transistor ST1 may be connected to the write scan line GWL, the drain electrode thereof may be connected to the second node N2, and the source electrode thereof may be connected to the first node N1. The drain electrode of the first transistor ST1 may be connected to the drain electrode of the driving transistor DT and the source electrode of the sixth transistor ST6 through the second node N2. The source electrode of the first transistor ST1 may be connected to the gate electrode of the driving transistor DT, the source electrode of the third transistor ST3, and the first electrode of a first capacitor C1 through the first node N1.

The second transistor ST2 may be turned on by a scan signal of the write scan line GWL to connect the data line DL with the third node N3, i.e., the source electrode of the driving transistor DT. The second transistor ST2 may be turned on in response to a scan signal to apply a data voltage to the third node N3. The gate electrode of the second transistor ST2 may be connected to the write scan line GWL, the source electrode thereof may be connected to the data line DL, and the drain electrode thereof may be connected to the third node N3. The drain electrode of the second transistor ST2 may be connected to the source electrode of the driving transistor DT and the drain electrode of the fifth transistor ST5 through the third node N3.

The third transistor ST3 may be turned on by a scan signal of the initialization scan line GIL to connect a first initialization voltage line VIL with the first node N1 which is the gate electrode of the driving transistor DT. The third transistor ST3 may be turned on in response to the scan signal to discharge the gate electrode of the driving transistor DT to an initialization voltage. The gate electrode of the third transistor ST3 may be connected to the initialization scan line GIL, the drain electrode thereof may be connected to the first initialization voltage line VIL, and the source electrode thereof may be connected to the first node N1. The source electrode of the third transistor ST3 may be connected to the gate electrode of the driving transistor DT, the source electrode of the first transistor ST1, and the first electrode of the first capacitor C1 through the first node N1.

The fourth transistor ST4 may be turned on by a scan signal of a bias scan line GBL to connect a second initialization voltage line VAIL with the fourth node N4 which is the anode electrode of the light-emitting element LE. The fourth transistor ST4 may be turned on in response to the scan signal of the bias scan line GBL to discharge the anode electrode of the light-emitting element EL to the initialization voltage. The gate electrode of the fourth transistor ST4 may be connected to the bias scan line GBL, the source electrode thereof may be connected to the second initialization voltage line VAIL, and the drain electrode thereof may be connected to the fourth node N4. The drain electrode of the fourth transistor ST4 may be connected to the anode electrode of the light-emitting element LE and the drain electrode of the sixth transistor ST6 through the fourth node N4.

The fifth transistor ST5 may be turned on by an emission signal of the emission line EL to connect the high-level voltage line VDL with the third node N3, i.e., the source electrode of the driving transistor DT. The gate electrode of the fifth transistor ST5 may be connected to the emission line EL, the source electrode thereof may be connected to the high-level voltage line VDL, and the drain electrode thereof may be connected to the third node N3. The drain electrode of the fifth transistor ST5 may be electrically connected to the source electrode of the driving transistor DT and the drain electrode of the second transistor ST2 through the third node N3.

The sixth transistor ST6 may be turned on by the emission signal of the emission line EL to connect the second node N2 which is the drain electrode of the driving transistor DT with the fourth node N4 which is the anode electrode of the light-emitting element LE. The gate electrode of the sixth transistor ST6 may be connected to the emission line EL, the source electrode thereof may be connected to the second node N2, and the drain electrode thereof may be connected to the fourth node N4. The source electrode of the sixth transistor ST6 may be connected to the drain electrode of the driving transistor DT and the drain electrode of the first transistor ST1 through the second node N2. The drain electrode of the sixth transistor ST6 may be connected to the anode electrode of the light-emitting element LE and the drain electrode of the fourth transistor ST4 through the fourth node N4.

When all of the fifth transistor ST5, the driving transistor DT and the sixth transistor ST6 are turned on, the driving current can be supplied to the light-emitting element EL.

The seventh transistor ST2 may be turned on by the scan signal of the write scan line GWL to connect a reference voltage line VREF with the third node N3, i.e., the source electrode of the driving transistor DT. The gate electrode of the seventh transistor ST7 may be connected to the write scan line GBL, the source electrode thereof may be connected to the reference voltage line VREF, and the drain electrode thereof may be connected to the third node N3. The drain electrode of the seventh transistor ST7 may be connected to the source electrode of the driving transistor DT through the third node N3.

Each of the driving transistor DT, the second transistor ST2, and the fourth to seventh transistors ST4, ST5, ST6 and ST7 may include a silicon-based active layer. For example, each of the driving transistor DT, the second transistor ST2, and the fourth to seventh transistors ST4, ST5, ST6 and ST7 may include an active layer made of low-temperature polycrystalline silicon (LTPS). The active layer made of low-temperature polycrystalline silicon may have a high electron mobility and excellent turn-on characteristics. Accordingly, the display device 10 includes the driving transistor DT, the second transistor ST2, and the fourth to seventh transistors ST4, ST5, ST6 and ST7 having excellent turn-on characteristics, so that the plurality of sub-pixels SP can be driven stably and efficiently.

Each of the driving transistor DT, the second transistor ST2, and the fourth to seventh transistors ST4, ST5, ST6 and ST7 may be a p-type transistor. For example, each of the driving transistor DT, the second transistor ST2, and the fourth to seventh transistors ST4, ST5, ST6 and ST7 may output a current flowing into the source electrode to the drain electrode in response to a gate-low voltage applied to the gate electrode.

Each of the first and third transistors ST1 and ST3 may include an oxide-based active layer. For example, each of the first and third transistors ST1 and ST3 may have a coplanar structure in which a gate electrode is disposed above an oxide-based active layer. A transistor having such a coplanar structure has excellent leakage current characteristics and allows for low-frequency driving, thereby reducing power consumption. Accordingly, the display device 10 includes the first and third transistors ST1 and ST3 having good off-current characteristics, so that it is possible to prevent leakage current from flowing inside the sub-pixels SPX, and to maintain the voltage inside the sub-pixels SPX.

Each of the first and third transistors ST1 and ST3 may be an n-type transistor. For example, each of the first and third transistors ST1 and ST3 may output a current flowing into the drain electrode to the source electrode in response to a gate-high voltage applied to the gate electrode.

The first capacitor C1 may be connected between the first node N1, i.e., the gate electrode of the driving transistor DT and the high-level voltage line VDL. For example, the first electrode of the first capacitor C1 is connected to the first node N4, and the second electrode of the first capacitor C1 is connected to the high-level voltage line VDL, such that the potential difference between the high-level voltage VDL and the gate electrode of the driving transistor DT can be held.

Figure 4:
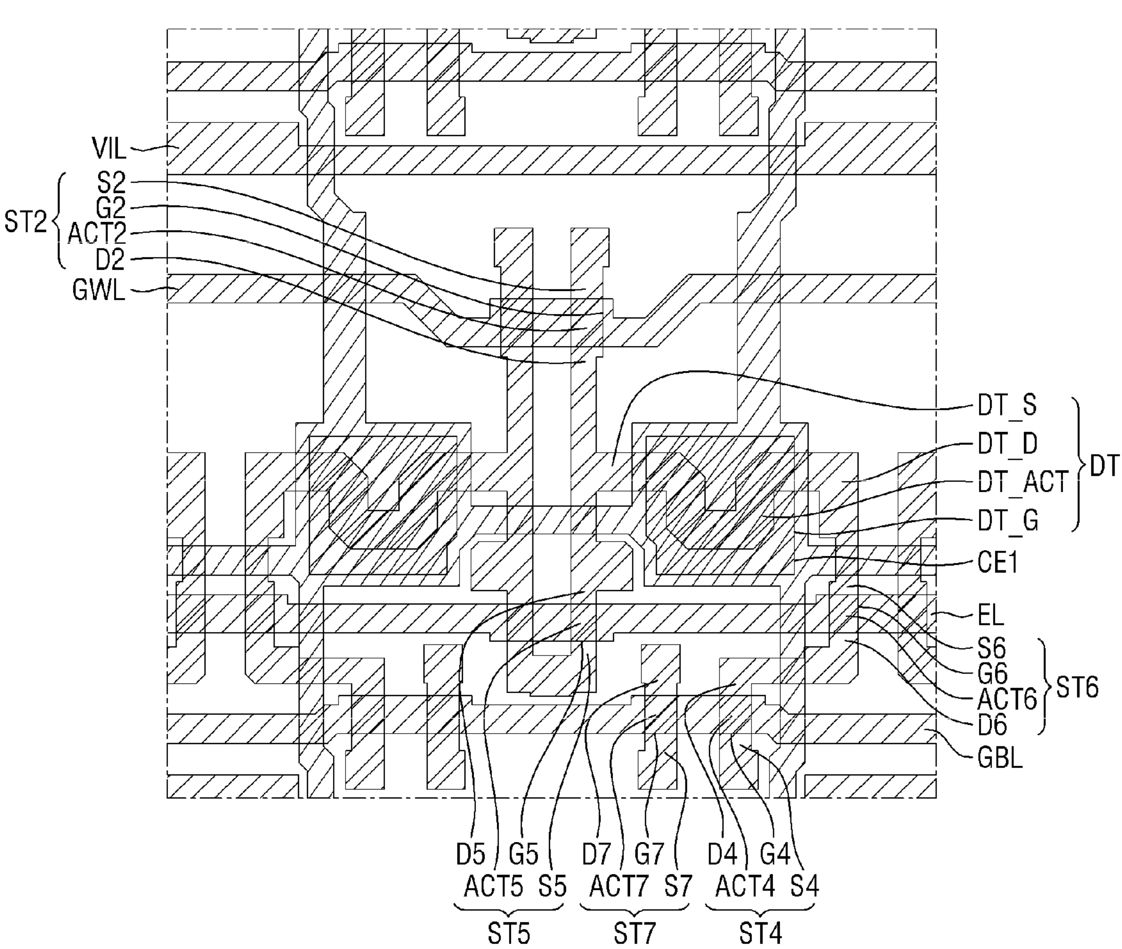
FIG. 4 is a plan view illustrating some layers of sub-pixels according to an embodiment.
Figure 5:
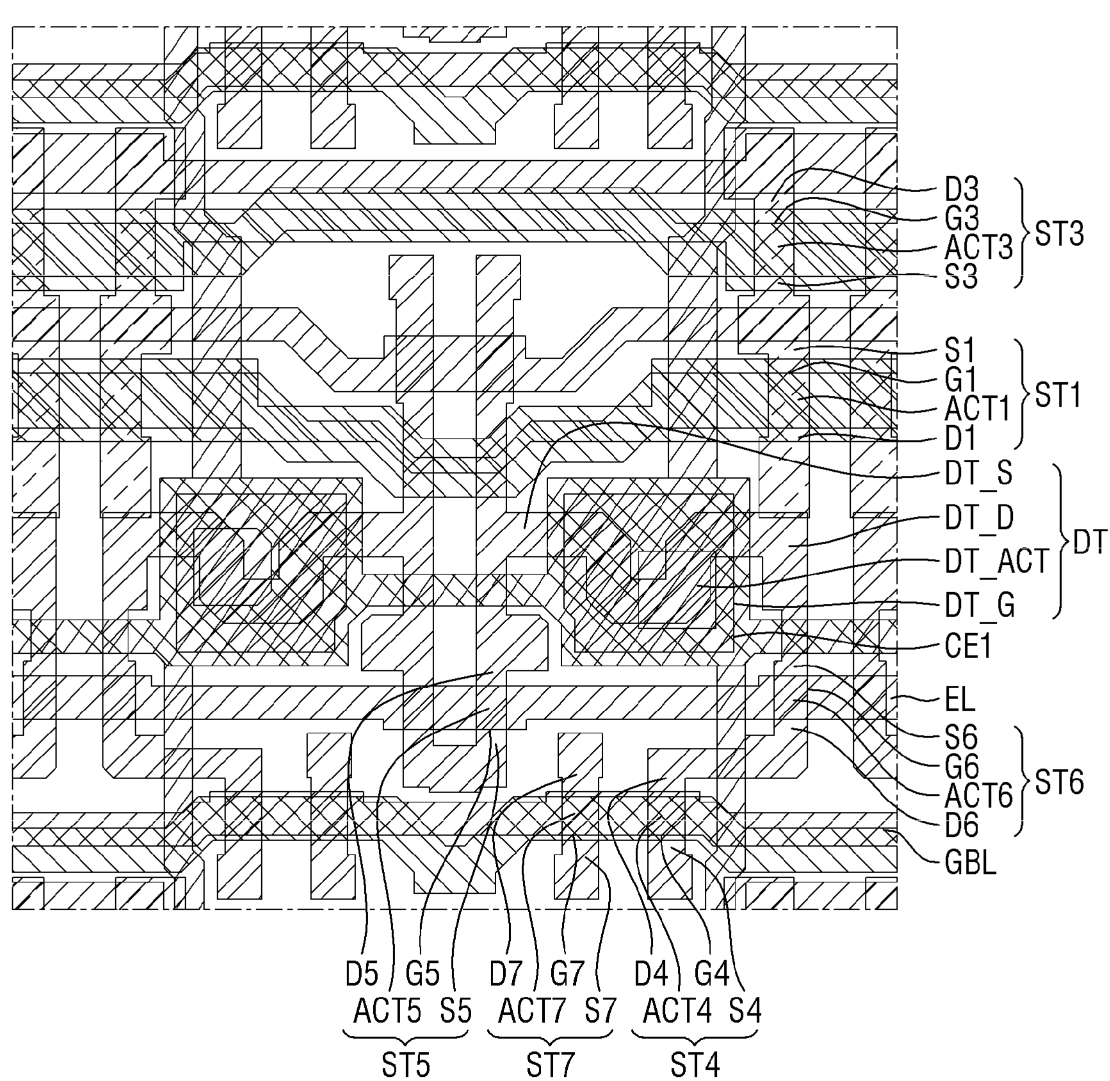
FIG. 5 is a plan view illustrating some other layers of sub-pixels according to an embodiment.
Figure 6:
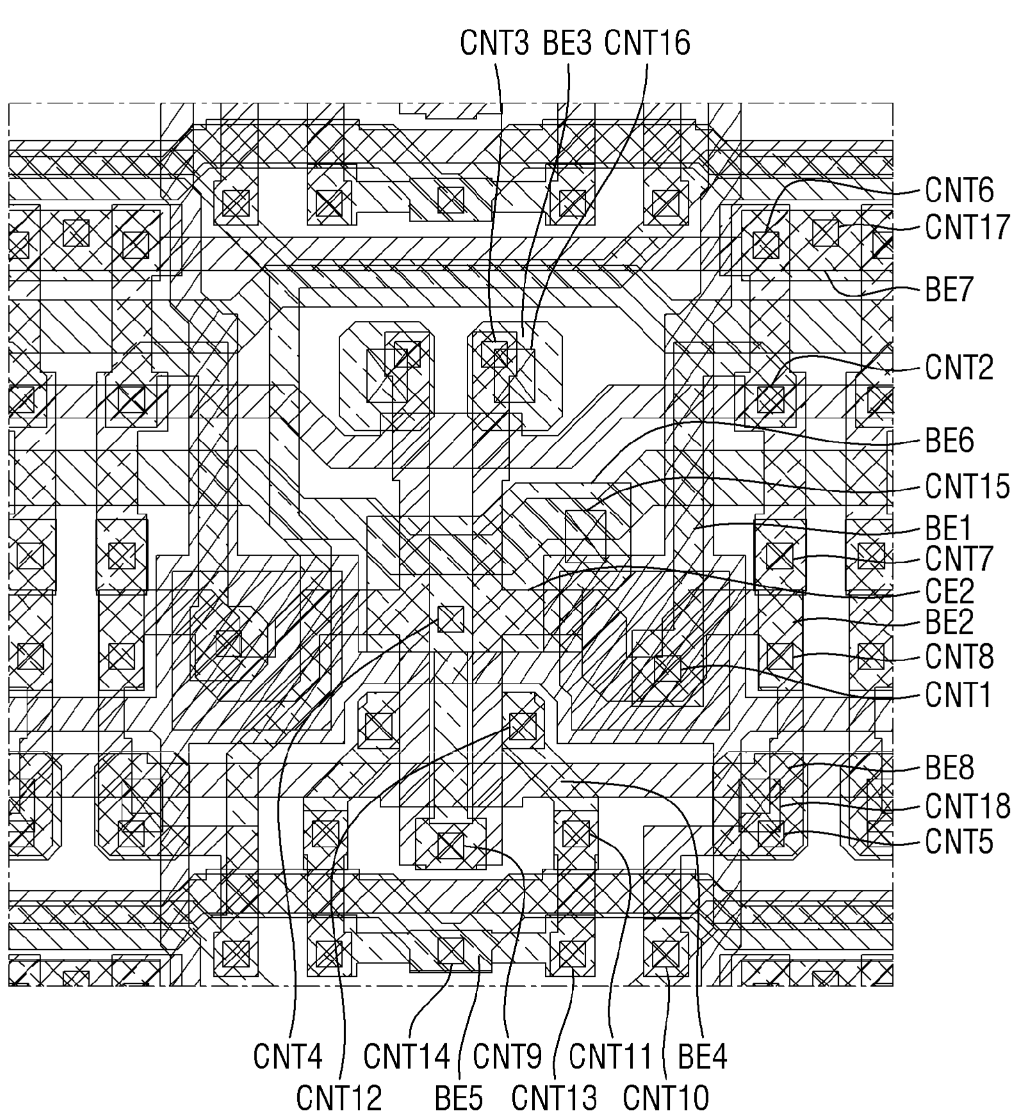
FIG. 6 is a plan view illustrating some yet other layers of sub-pixels according to an embodiment.
Figure 7:
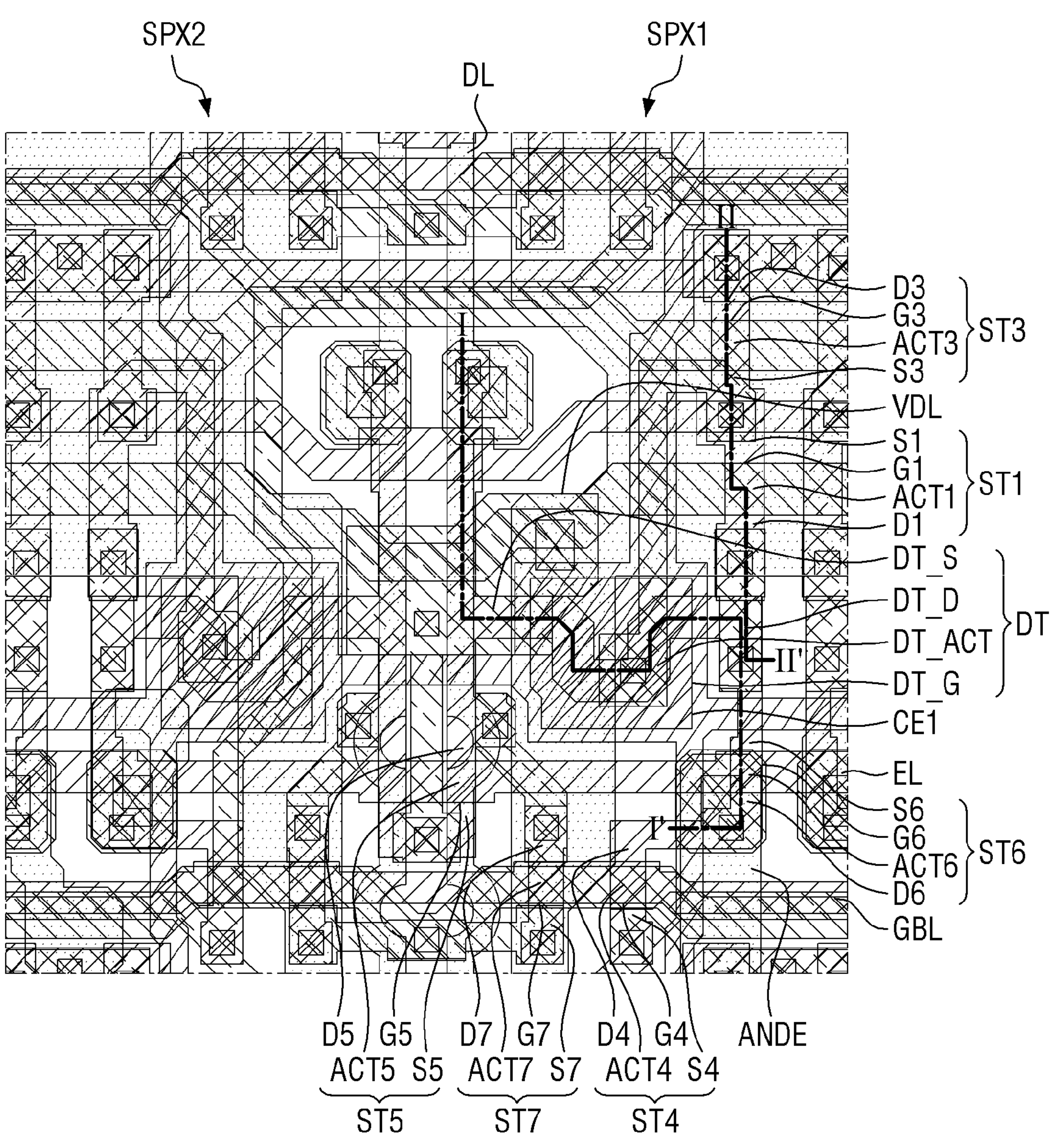
FIG. 7 is a plan view illustrating an example of sub-pixels according to an embodiment.

FIG. 4 is a plan view illustrating some layers of sub-pixels according to an embodiment. FIG. 5 is a plan view illustrating some other layers of sub-pixels according to an embodiment. FIG. 6 is a plan view illustrating some yet other layers of sub-pixels according to an embodiment. FIG. 7 is a plan view illustrating an example of sub-pixels according to an embodiment.

In FIG. 4, a light-blocking layer, a first active layer, and a first gate layer are stacked on one another in this order. In FIG. 5, the light-blocking layer, the first active layer, the first gate layer, a second gate layer, a second active layer, and a third gate layer are stacked on one another in this order. In FIG. 6, the light-blocking layer, the first active layer, the first gate layer, the second gate layer, the second active layer, a third gate layer, and a first data layer are stacked on one another in this order. In FIG. 7, the light-blocking layer, the first active layer, the first gate layer, the second gate layer, the second active layer, a third data layer, the first data layer, and a second data layer are stacked on one another in this order.

Referring to FIGS. 4, 5, 6, and 7, a first sub-pixel SPX1 and a second sub-pixel SPX2 may be included. As depicted in FIG. 7, the first sub-pixel SPX1 may be disposed on the right side in the drawings, while the second sub-pixel SPX2 may be disposed on the left side in the drawings. The first sub-pixel SPX1 and the second sub-pixel SPX2 may be generally symmetrical to each other. Each of the first sub-pixel SPX1 and the second sub-pixel SPX2 may include a driving transistor DT, a light-emitting element LE, first to seventh transistors ST1, ST2, ST3, ST4, ST5 and ST7, and a first capacitor C1.

The driving transistor DT may include an active area DT_ACT, a gate electrode DT_G, a source electrode DT_S, and a drain electrode DT_D. The active area DT_ACT of the driving transistor DT may be disposed in the first active layer and may overlap the gate electrode DT_G of the driving transistor DT. For example, the first active layer may be made of low-temperature polycrystalline silicon (LTPS).

The gate electrode DT_G of the driving transistor DT may be connected to a first connection electrode BE1 through a first contact hole CNT1, and the first connection electrode BE1 may be connected to the second active layer through a second contact hole CNT2. For example, the second active layer may be made of an oxide-based material. The first connection electrode BE1 may be connected to the source electrode S3 of the third transistor ST3 and the source electrode S1 of the first transistor ST1. In addition, a portion of the gate electrodes DT_G of the driving transistor DT that overlaps the second gate layer may work as a first capacitor electrode CE1 of the first capacitor C1.

The source electrode DT_S of the driving transistor DT may be connected to the drain electrode D2 of the second transistor ST2 and the drain electrode D5 of the fifth transistor ST5.

The drain electrode DT_D of the driving transistor DT may be connected to a second connection electrode BE2 through an eighth contact hole CNT8, and the second connection electrode BE2 may be connected to a drain electrode D1 of the first transistor ST1 through a seventh contact hole CNT7. In addition, the drain electrode DT_D of the driving transistor DT may be connected to a source electrode S6 of the sixth transistor ST6.

The first transistor ST1 may include an active area ACT1, a gate electrode G1, a source electrode S1, and a drain electrode D1. The active area ACT1 of the first transistor ST1 may overlap the gate electrode G1 of the first transistor ST1. For example, the active area ACT1 of the first transistor ST1 may be made of an oxide-based material. The gate electrode G1 of the first transistor ST1 may be a portion of the control scan line GCL, which overlaps the active area ACT1.

The drain electrode D1 of the first transistor ST1 may be connected to the second connection electrode BE2 through the seventh contact hole CNT7, and the second connection electrode BE2 may be connected to the drain electrode DT_D of the driving transistor DT and the source electrode S6 of the sixth transistor ST6 through the eighth contact hole CNT8. The source electrode S1 of the fifth transistor ST1 may be connected to the source electrode S3 of the third transistor ST3. In addition, the source electrode S1 of the first transistor ST1 may be connected to the first connection electrode BE1 through the second contact hole CNT2, and the first connection electrode BE1 may be connected to the gate electrode DT_G of the driving transistor DT or the first capacitor electrode CE1 of the first capacitor C1 through the first contact hole CNT1.

The second transistor ST2 may include an active area ACT2, a gate electrode G2, a source electrode S2, and a drain electrode D2. The active area ACT2 of the second transistor ST2 may overlap the gate electrode G2 of the second transistor ST2. For example, the active area ACT2 of the second transistor ST2 may be made of low-temperature polycrystalline silicon (LTPS). The gate electrode G2 of the second transistor ST2 may be a portion of the write scan line GWL, which overlaps the active area ACT1.

The source electrode S2 of the second transistor ST2 may be connected to a third connection electrode BE3 through a third contact hole CNT3, and the third connection electrode BE3 may be connected to the data line DL. Accordingly, the source electrode S2 of the second transistor ST2 may receive the data voltage from the data line DL. The drain electrode D2 of the second transistor ST2 may be connected to the source electrode DT_S of the driving transistor DT and the drain electrode D5 of the fifth transistor ST5.

The third transistor ST3 may include an active region ACT3, a gate electrode G3, a drain electrode D3, and a source electrode S3. The active region ACT3 of the third transistor ST3 may overlap the gate electrode G3 of the third transistor ST3. For example, the active area ACT3 of the third transistor ST3 may include an oxide-based active layer. The gate electrode G3 of the third transistor ST3 may be a portion of the initialization scan line GIL, which overlaps the active area ACT3.

The drain electrode D3 of the third transistor ST3 may be connected to the first initialization voltage line VIL through a sixth contact hole CNT6. The source electrode S3 of the third transistor ST3 may be connected to the source electrode S1 of the first transistor ST1. In addition, the drain electrode D3 of the third transistor ST3 may be connected to a seventh connection electrode BE7 through the sixth contact hole CNT6, and the seventh connection electrode BE7 may be connected to the first initialization voltage line VIL through a seventeenth contact hole CNT17. The source electrode S3 of the third transistor ST3 may be connected to the first connection electrode BE1 through the second contact hole CNT2, and the first connection electrode BE1 may be connected to the gate electrode DT_G of the driving transistor DT or the first capacitor electrode CE1 of the first capacitor C1 through the first contact hole CNT1.

The fourth transistor ST4 may include an active region ACT4, a gate electrode G4, a drain electrode D4, and a source electrode S4. The active region ACT4 of the fourth transistor ST4 may overlap the gate electrode G4 of the fourth transistor ST4. For example, the active region ACT4 of the fourth transistor ST4 may be made of low-temperature polycrystalline silicon (LTPS). The gate electrode G4 of the fourth transistor ST4 may be a portion of the scan bias line GBL, which overlaps the active area ACT4.

The source electrode S4 of the fourth transistor ST4 may be connected to the first initialization voltage line VIL through a tenth contact hole CNT10. The drain electrode D4 of the fourth transistor ST4 may be connected to an anode connection electrode ANDE through the fifth contact hole CNT5. The anode connection electrode ANDE may be connected to the anode electrode of the light-emitting element LE.

The fifth transistor ST5 may include an active area ACT5, a gate electrode G5, a source electrode S5, and a drain electrode D5. The active area ACT5 of the fifth transistor ST5 may overlap the gate electrode G5 of the fifth transistor ST5. For example, the active region ACT5 of the fifth transistor ST5 may be made of low-temperature polycrystalline silicon (LTPS). The gate electrode G5 of the fifth transistor ST5 may be a portion of the emission line EL, which overlaps the active area ACT5.

The source electrode S5 of the fifth transistor ST5 may be connected to the high-level voltage line VDL through the ninth contact hole CNT9. Accordingly, the source electrode S5 of the fifth transistor ST5 may receive the supply voltage from the high-level voltage line VDL. The drain electrode D5 of the fifth transistor ST5 may be connected to the source electrode DT_S of the driving transistor DT and the drain electrode D2 of the second transistor ST2.

The sixth transistor ST6 may include an active area ACT6, a gate electrode G6, a source electrode S6, and a drain electrode D6. The active area ACT6 of the sixth transistor ST6 may overlap the gate electrode G6 of the sixth transistor ST6. For example, the active area ACT6 of the sixth transistor ST6 may be made of low-temperature polycrystalline silicon (LTPS). The gate electrode G6 of the sixth transistor ST6 may be a portion of the emission line EL, which overlaps the active area ACT6.

The source electrode S6 of the sixth transistor ST6 may be connected to the drain electrode DT_D of the driving transistor DT. The source electrode S6 of the sixth transistor ST6 may be connected to the second connection electrode BE2 through the eighth contact hole CNT8, and the second connection electrode BE2 may be connected to a drain electrode D1 of the first transistor ST1 through the seventh contact hole CNT7. The drain electrode D6 of the sixth transistor ST6 may be connected to the eighth connection electrode BE8 through the fifth contact hole CNT5, and the eighth connection electrode BE8 may be connected to the anode connection electrode ANDE through an eighteenth contact hole CNT18. The anode connection electrode ANDE may be connected to the anode electrode of the light-emitting element LE.

The seventh transistor ST7 may include an active region ACT7, a gate electrode G7, a source electrode S7 and a drain electrode D7. The active area ACT7 of the seventh transistor ST7 may overlap the gate electrode G7 of the seventh transistor ST7. For example, the active area ACT7 of the seventh transistor ST7 may be made of low-temperature polycrystalline silicon (LTPS). The gate electrode G7 of the seventh transistor ST7 may be a portion of the write scan line GWL, which overlaps the active area ACT7.

The source electrode S7 of the seventh transistor ST7 may be connected to a fifth connection electrode BE5 through a thirteenth contact hole CNT13. The drain electrode D7 of the seventh transistor ST7 may be connected to the source electrode DT_S of the driving transistor DT. In addition, the drain electrode D7 of the seventh transistor ST7 may be connected to the fourth connection electrode BE7 through an eleventh contact hole CNT11, and the fourth connection electrode BE4 may be connected to the drain electrode D5 of the fifth transistor ST5 through a twelfth contact hole CNT12.

The first capacitor C1 may include a first capacitor electrode CE1 and a second capacitor electrode CE2. The first capacitor electrode CE1 of the first capacitor C1 may be a portion of the gate electrode DT_G of the driving transistor DT, which overlaps the second gate layer. The first capacitor electrode CE1 of the first capacitor C1 may be connected to the first connection electrode BE1 through the first contact hole CNT1. The first connection electrode BE1 may be connected to the source electrode S3 of the third transistor ST3 and the source electrode S1 of the first transistor ST1 through the second contact hole CNT2.

The second capacitor electrode CE2 of the first capacitor C1 may be connected to the sixth connection electrode BE6 through the fourth contact hole CNT4. The sixth connection electrode BE6 may be connected to the high-level voltage line VDL through a fifteenth contact hole CNT15. Accordingly, the second capacitor electrode CE2 of the first capacitor C1 may receive the supply voltage from the high-level voltage line VDL.

Figure 8:
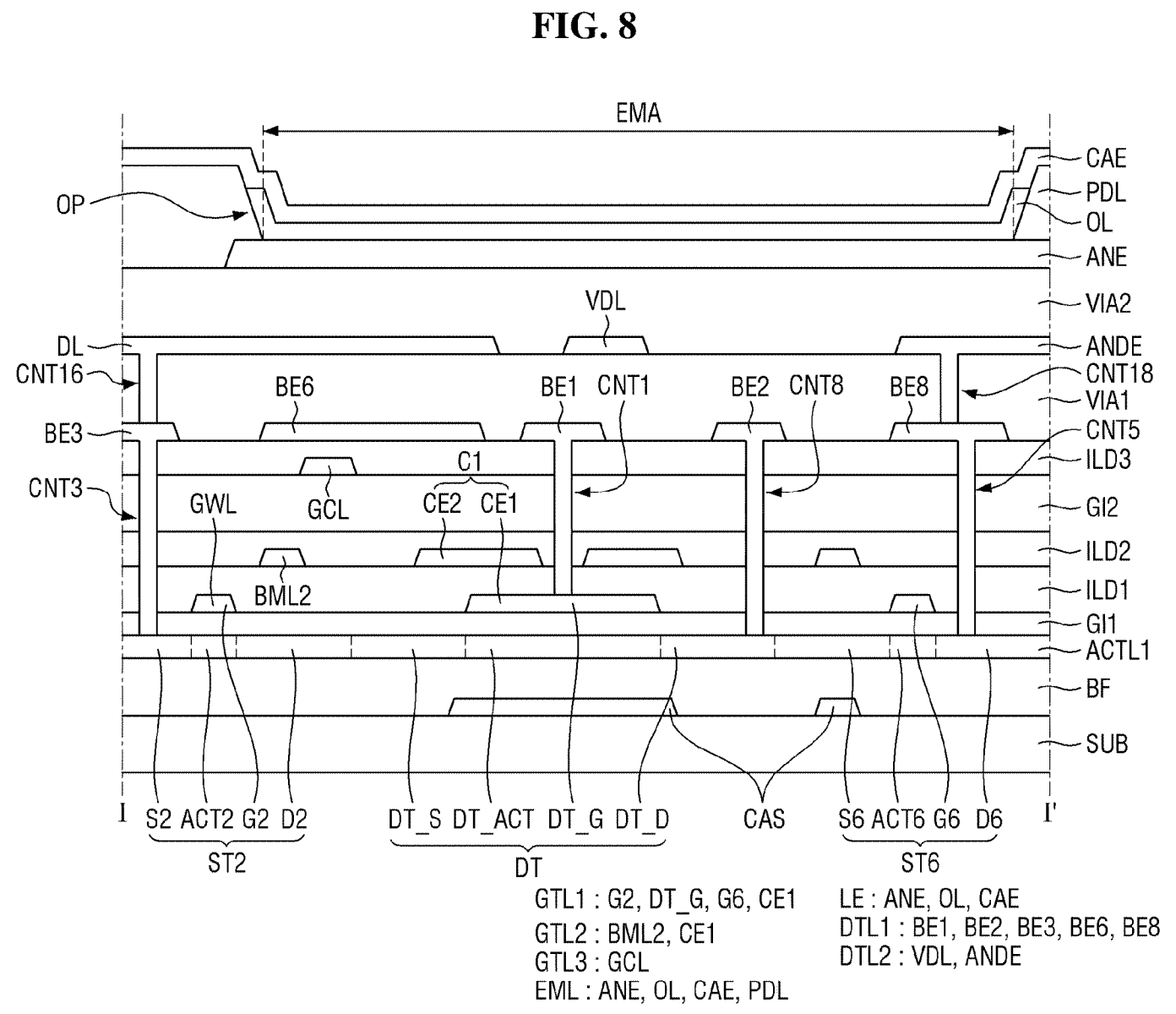
Figure 9:
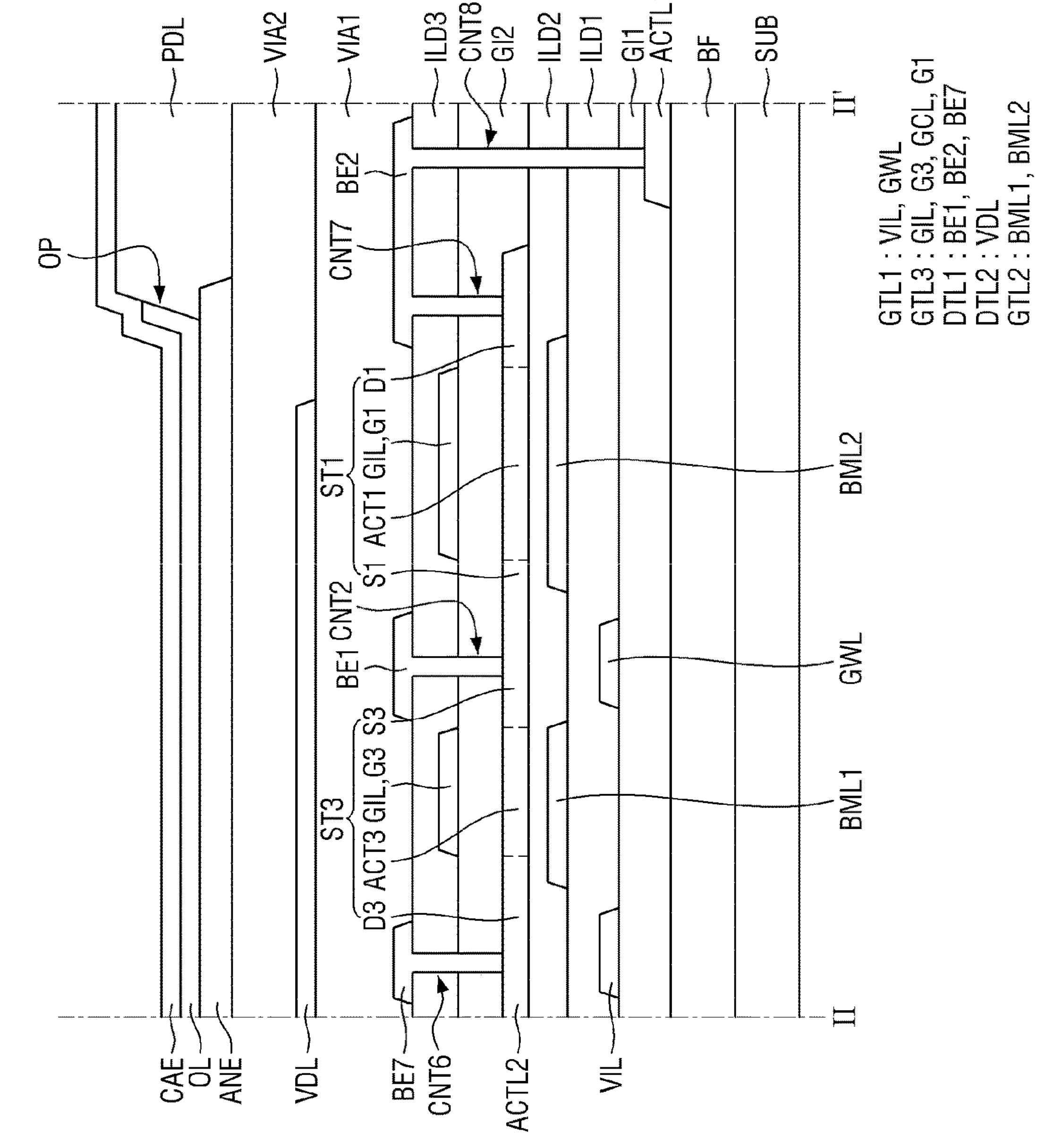
FIG. 9 is a cross-sectional view taken along line II-II' of FIG. 7.

FIG. 8 is a cross-sectional view taken along line I-I' of FIG. 7. FIG. 9 is a cross-sectional view taken along line II-II' of FIG. 7.

Referring to FIGS. 8 and 9 in conjunction with FIGS. 4, 5, 6, and 7, the display device 10 according to the embodiment may include a substrate SUB, a light-blocking layer CAS, a buffer layer BF, a first active layer ACTL1, a first gate insulator GI1, a first gate layer GTL1, a first interlayer dielectric layer ILD1, a second gate layer GTL2, a second interlayer dielectric layer ILD2, a second active layer ACTL2, a second gate insulator GI2, a third gate layer GTL3, a third interlayer dielectric layer ILD3, and first and second data layers DTL1 and DTL2.

The substrate SUB may be a base substrate and may be made of an insulating material such as a polymer resin. For example, the substrate SUB may be a flexible substrate that can be bent, folded, or rolled.

The light-blocking layer CAS may be disposed between the substrate SUB and the buffer layer BF. The light-blocking layer CAS may overlap the gate electrode DT_G and the active area DT_ACT of the driving transistor DT and the source electrode S6 of the sixth transistor ST6 in the thickness direction of the substrate SUB. The light-blocking layer CAS may overlap at least a portion of the first active layer ACTL1. The light-blocking layer CAS blocks lights incident on the active area DT_ACT of the driving transistor DT, so that the turn-on characteristics of the transistor, the threshold voltage Vth characteristics, and the swing below the threshold voltage Vth, i.e., subthreshold swing (SS) characteristics can be improved.

According to another embodiment, the light-blocking layer CAS may be disposed between the substrate SUB and the buffer layer BF, and may overlap the first to seventh transistors ST1 to ST7. For example, the light-blocking layer CAS may overlap the active layers ACT1 to ACTT of the first to seventh transistors ST1 to ST7. It should be understood, however, that the present disclosure is not limited thereto. The light-blocking layer CAS may overlap at least some of the first to seventh transistors ST1 to ST7 and may not overlap some others.

In addition, the light-blocking layer CAS may be electrically connected to one of the first to fourth nodes N1 to N4 although it is not shown here. For example, the light-blocking layer CAS may be connected to one of the driving transistor DT and the first to seventh transistors ST1 to ST7. Accordingly, the light-blocking layer CAS may stably maintain the voltage of the connected nodes and prevent coupling with other electrodes.

In addition, the light-blocking layer CAS may be formed as one body. For example, the light-blocking layer CAS may be arranged in a mesh topology on the substrate SUB. According to another embodiment, the light-blocking layer CAS may be disposed in a pattern of separated pieces.

The buffer layer BF may be disposed on the substrate SUB and may entirely cover the light-blocking layer CAS. For example, the buffer layer BF may include a plurality of inorganic layers, and may be formed on the entire upper surface of the substrate SUB in order to block moisture permeating into the light-emitting element LE through the substrate SUB. The buffer layer BF may be formed of a plurality of inorganic layers stacked on one another alternately. For example, the buffer layer BF may be multiple films in which one or more inorganic layers of a silicon nitride layer, a silicon oxide layer, a silicon oxynitride layer, a titanium oxide layer, and an aluminum oxide layer are stacked on one another. It is, however, to be noted that the buffer layer BF may be eliminated.

The first active layer ACTL1 may be disposed on the buffer layer BF. The first active layer ACTL1 may be made of a silicon-based material. For example, the first active layer ACTL1 may be made of low-temperature polycrystalline silicon (LTPS). The first active layer ACTL1 may include the active areas DT_ACT, ACT2, ACT4, ACT5, ACT6 and ACTT, the source electrodes DT_S, S2, S4, S5, S6 and S7, and the drain electrodes DT_D, D2, D4, D5, D6 and D7 of the driving transistor DT, the second transistor ST2, and the fourth to seventh transistors ST4, ST5, ST6 and ST7.

The first gate insulator GI1 may be disposed on the buffer layer BF and the first active layer ACTL1. The first gate insulator GI1 may be disposed on the buffer layer BF to cover the first active layer ACTL1. The first gate insulator GI1 may insulate the first active layer ACTL1 from the first gate layer GTL1. The first gate insulator GI1 may include a single inorganic layer or a plurality of inorganic layers alternately stacked on one another. For example, the first gate insulator GI1 may be a stack of multiple films in which one or more inorganic layers of a silicon nitride layer, a silicon oxide layer, a silicon oxynitride layer, a titanium oxide layer, and an aluminum oxide layer are alternately stacked on one another.

The first gate layer GTL1 may be disposed on the first gate insulator GI1. The first gate layer GTL1 may include the gate electrode DT_G of the driving transistor DT, the first capacitor electrode CE1, the first initialization voltage line VIL, the write scan line GWL, the emission line EL, the scan bias line GBL. The write scan line GWL may include the gate electrode G2 of the second transistor ST2. The scan bias line GBL may include the gate electrode G4 of the fourth transistor ST4 and the gate electrode G7 of the seventh transistor ST7. The emission line EL may include the gate electrode G5 of the fifth transistor ST5 and the gate electrode G6 of the sixth transistor ST6.

The first gate layer GTL1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The first interlayer dielectric layer ILD1 may be disposed on the first gate insulator GI1. The first interlayer dielectric layer ILD1 may be disposed on the first gate insulator GI1 to cover the first gate layer GTL1. The first interlayer dielectric layer ILD1 may insulate the first gate layer GTL1 from the second gate layer GTL2. The first interlayer dielectric layer ILD1 may include a single inorganic layer or a plurality of inorganic layers alternately stacked on one another. For example, the first interlayer dielectric layer ILD1 may be a stack of multiple films in which one or more inorganic layers of a silicon nitride layer, a silicon oxide layer, a silicon oxynitride layer, a titanium oxide layer, and an aluminum oxide layer are alternately stacked on one another.

The second gate layer GTL2 may be disposed on the first interlayer dielectric layer ILD1. The second gate layer GTL2 may include the second capacitor electrode CE2 of the first capacitor C1, a first metal layer BML1, and a second metal layer BML2. The first metal layer BML1 may overlap the third transistor ST3 in the thickness direction to block light incident on the third transistor ST3. The second metal layer BML2 may overlap the first transistor ST1 in the thickness direction to block light incident on the first transistor ST1. The first and second metal layers BML1 and BML2 block lights incident on the first and third transistors ST1 and ST3, respectively, thereby improving turn-on characteristics of the transistors. The second capacitor electrode CE2 of the first capacitor C1 may overlap the first capacitor electrode CE1 of the first gate layer GTL1.

The second gate layer GTL2 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The second interlayer dielectric layer ILD2 may be disposed on the first interlayer dielectric layer ILD1 to cover the second gate layer GTL2. The second interlayer dielectric layer ILD2 may insulate the second gate layer GTL2 from the second active layer ACTL2. The second interlayer dielectric layer ILD2 may include a single inorganic layer or a plurality of inorganic layers alternately stacked on one another. For example, the second interlayer dielectric layer ILD2 may be a stack of multiple films in which one or more inorganic layers of a silicon nitride layer, a silicon oxide layer, a silicon oxynitride layer, a titanium oxide layer, and an aluminum oxide layer are alternately stacked on one another.

The second active layer ACTL2 may be disposed on the second interlayer dielectric layer ILD2. The second active layer ACTL2 may be made of an oxide-based material. The second active layer ACTL2 may include the active areas ACT1 and ACT3, the drain electrodes D1 and D3, and the source electrodes S1 and S3 of the first and third transistors ST1 and ST3.

The second gate insulator GI2 may be disposed on the second interlayer dielectric layer ILD2. The second gate insulator GI2 may be disposed on the second interlayer dielectric layer ILD2 to cover the second active layer ACTL2. The second gate insulator GI2 may insulate the second active layer ACTL2 from the third gate layer GTL3.

The third gate layer GTL3 may be disposed on the second gate insulator GI2. The third gate layer GTL3 may include the initialization scan line GIL, the control scan line GCL, and the reference voltage line VREF. The initialization scan line GIL may include the gate electrode G3 of the third transistor ST3. The control scan line GCL may include the gate electrode G1 of the first transistor ST1.

The third gate layer GTL3 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The third interlayer dielectric layer ILD3 may be disposed on the second gate insulator GI2. The third interlayer dielectric layer ILD3 may be disposed on the second gate insulator GI2 to cover the third gate layer GTL3. The third interlayer dielectric layer ILD3 may insulate the third gate layer GTL3 from the first data layer DTL1. The third interlayer dielectric layer ILD3 may include a single inorganic layer or a plurality of inorganic layers alternately stacked on one another. For example, the third interlayer dielectric layer ILD3 may be a stack of multiple films in which one or more inorganic layers of a silicon nitride layer, a silicon oxide layer, a silicon oxynitride layer, a titanium oxide layer, and an aluminum oxide layer are alternately stacked on one another.

The first data layer DTL1 may be disposed on the third interlayer dielectric layer ILD3. The first data layer DTL1 may include first to eighth connection electrodes BE1, BE2, BE3, BE4, BE5, BE6, BE7, and BE8.

The first connection electrode BE1 may be connected to the gate electrode DT_G of the driving transistor DT through the first contact hole CNT1 (shown in FIG. 8), and may be connected to the source electrode S1 of the first transistor ST1 and the source electrode S3 of the third transistor ST3 through the second contact hole CNT2 (shown in FIG. 9).

The second connection electrode BE2 may be connected to the drain electrode D1 of the first transistor ST1 through the seventh contact hole CNT7, and may be connected to the drain electrode DT_D of the driving transistor DT and the source electrode S6 of the sixth transistor ST6 through the eighth contact hole CNT8 (shown in FIG. 9).

The third connection electrode BE3 may be connected to the source electrode S2 of the second transistor ST2 through the third contact hole CNT3. In addition, the third connection electrode BE3 may be connected to the data line DL through the sixteenth contact hole CNT16 (not shown herein).

The fourth connection electrode BE4 may be connected to the drain electrode D7 of the seventh transistor ST7 through the eleventh contact hole CNT11, and may be connected to the drain electrode DT_D of the driving transistor DT and the drain electrode D2 of the second transistor ST2 through the twelfth contact hole CNT12 (not shown herein).

The fifth connection electrode BE5 may be connected to the source electrode S7 of the seventh transistor ST7 through the thirteenth contact hole CNT13, and may be connected to the reference voltage line VREF through the fourteenth contact hole CNT14 (not shown herein).

The sixth connection electrode BE6 may be connected to the second capacitor electrode CE2 of the first capacitor C1 through the fourth contact hole CNT4, and may be connected to the high-level voltage line VDL through the fifteenth contact hole CNT15 (not shown herein).

The seventh connection electrode BE7 may be connected to the drain electrode D3 of the third transistor ST3 through the sixth contact hole CNT6, and may be connected to the first initialization voltage line VIL (not shown herein).

The eighth connection electrode BE8 may be connected to the drain electrode D6 of the sixth transistor ST6 through the fifth contact hole CNT5 and may be connected to the anode connection electrode ANDE through the eighteenth contact hole CNT18 (shown in FIG. 8).

A first via layer VIA1 may be disposed on the third interlayer dielectric layer ILD3 to cover the first data layer DTL1. The first via layer VIA1 may insulate the first data layer DTL1 from the second data layer DTL2. The first via layer VIA1 may include an organic material layer and may be, for example, polyimide.

The second data layer DTL2 may be disposed on the first via layer VIAL The second data layer DTL2 may include the data line DL and the high-level voltage line VDL. The data line DL may be connected to the third connection electrode BE3 through the sixteenth contact hole CNT16, and the third connection electrode BE3 may be connected to the source electrode S2 of the second transistor ST2 through the third contact hole CNT3. The high-level voltage line VDL may be connected to the sixth connection electrode BE6 through the fifteenth contact hole CNT15. The sixth connection electrode BE6 may be connected to the first capacitor electrode CE1 of the first capacitor C1 through the fourth contact hole CNT4 and may be connected to the source electrode S5 of the fifth transistor ST5 through the ninth contact hole CNT9.

A second via layer VIA2 may be disposed on the first via layer VIAL The second via layer VIA2 may be disposed on the first via layer VIA1 to cover the second data layer DTL2. The second via layer VIA2 may insulate the second data layer DTL2 from the emission material layer EML (not shown herein).

The display device 10 according to the embodiment may include the emission material layer EML disposed on the second via layer VIA2. The emission material layer EML may include a pixel-defining film PDL and light-emitting elements LE. Each of the light-emitting elements LE may include an anode electrode ANE, an organic light-emitting layer OL, and a cathode electrode CAE.

The anode electrode ANE may be disposed on the second via layer VIA2. The anode electrode ANE may be connected to the drain electrode D6 of the sixth transistor ST6 through the anode connection electrode ANDE and the eighth connection electrode BE8. The anode electrode ANE may include a metal material having high reflectivity, such as aluminum, titanium, ITO and an APC alloy. The APC alloy is an alloy of silver (Ag), palladium (Pd) and copper (Cu). For example, the anode electrode ANE may be formed as a stack of aluminum and titanium (Ti/Al/Ti), a stack of aluminum and ITO (ITO/Al/ITO), a stack of an APC alloy and ITO (ITO/APC/ITO), etc.

The pixel-defining film PDL may distinguish or define the emission areas EMA. In the emission area EMA, the anode electrode ANE, the organic light-emitting layer OL, and the cathode electrode CAE are sequentially stacked in the thickness direction of the substrate SUB so that holes from the anode electrode ANE and electrons from the cathode electrode CAE recombine in the organic light-emitting layer OL to emit lights.

The pixel-defining film PDL may be formed to expose a portion of the anode electrode ANE through an opening OP and cover the edge of the anode electrode ANE. The pixel-defining film PDL may be formed of an organic layer such as an acryl resin, an epoxy resin, a phenolic resin, a polyamide resin and a polyimide resin.

The organic light-emitting layer OL may be disposed on the anode electrode ANE and the pixel-defining film PDL. The organic light-emitting layer OL may include an organic material and emit light of a particular color. For example, the organic light-emitting layer OL may include at least a light-emitting layer, and may include at least one of a hole injection layer, a hole transporting layer, an electron transporting layer, and an electron injection layer.

The cathode electrode CAE may be disposed on the organic light-emitting layer OL and the pixel-defining film PDL. The cathode electrode CAE may be formed to cover the organic light-emitting layer OL. The cathode electrode CAE may be formed across emission areas EMA.

In the top-emission organic light-emitting diode, the cathode electrode CAE may be made of a transparent conductive material (TCP) such as ITO and IZO that can transmit light, or a semi-transmissive conductive material such as magnesium (Mg), silver (Ag) and an alloy of magnesium (Mg) and silver (Ag). When the cathode electrode CAE is made of a semi-transmissive metal material, the light extraction efficiency can be increased by using microcavities.

Figure 10:
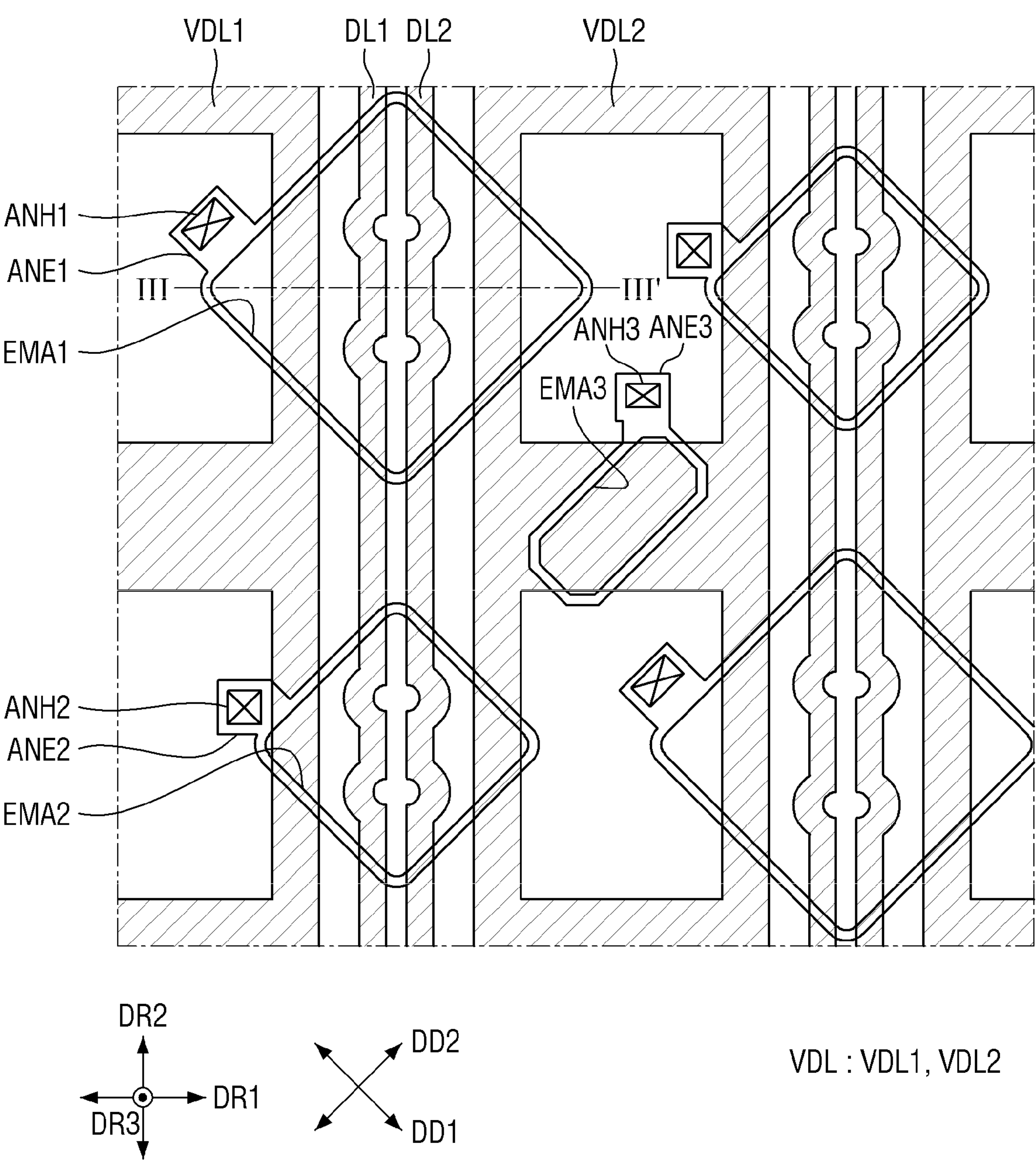
FIG. 10 is a plan view illustrating a second data layer and anode electrodes of sub-pixels according to an embodiment.
Figure 11:
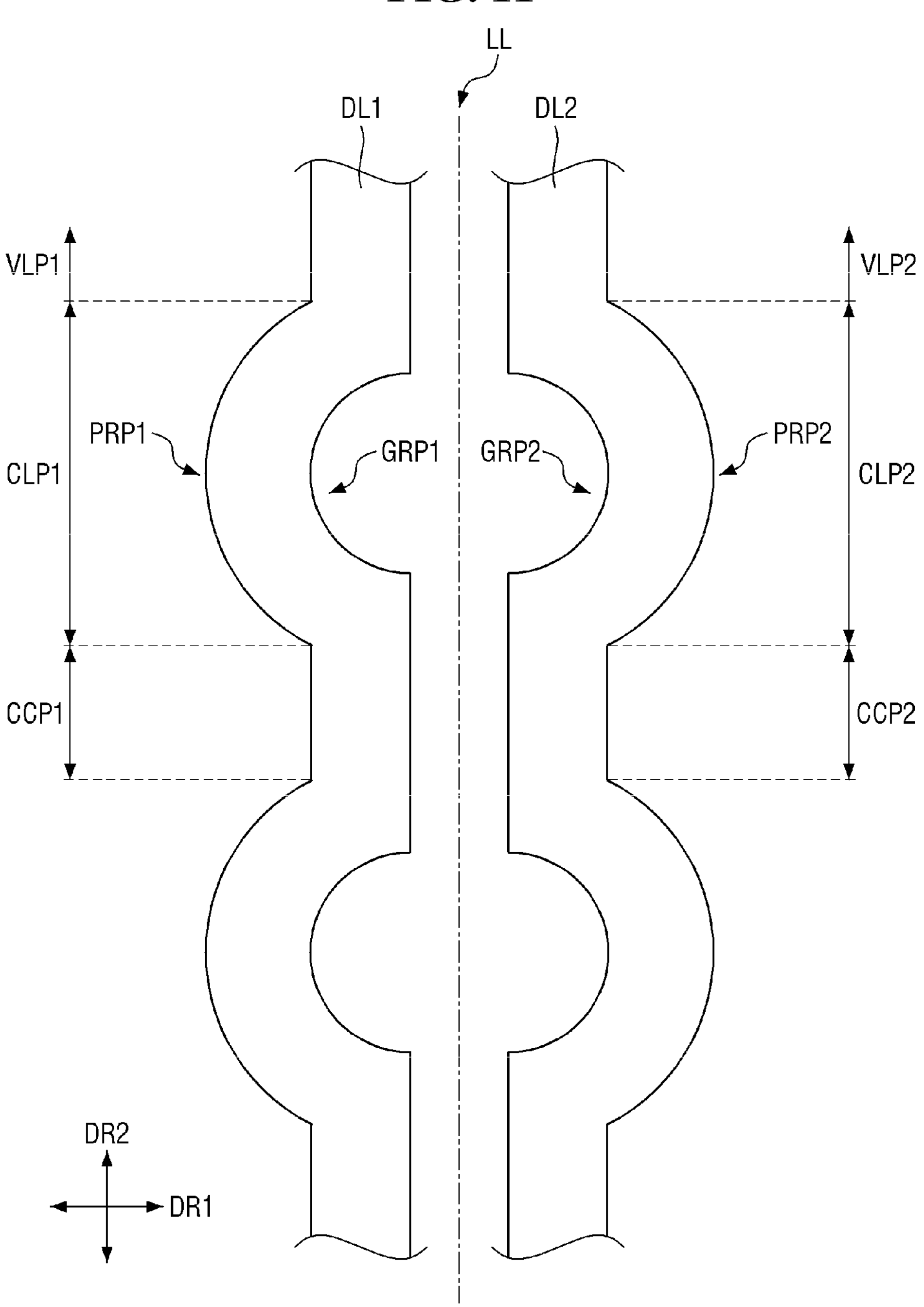
FIG. 11 is a plan view illustrating the data lines of FIG. 10.
Figure 12:
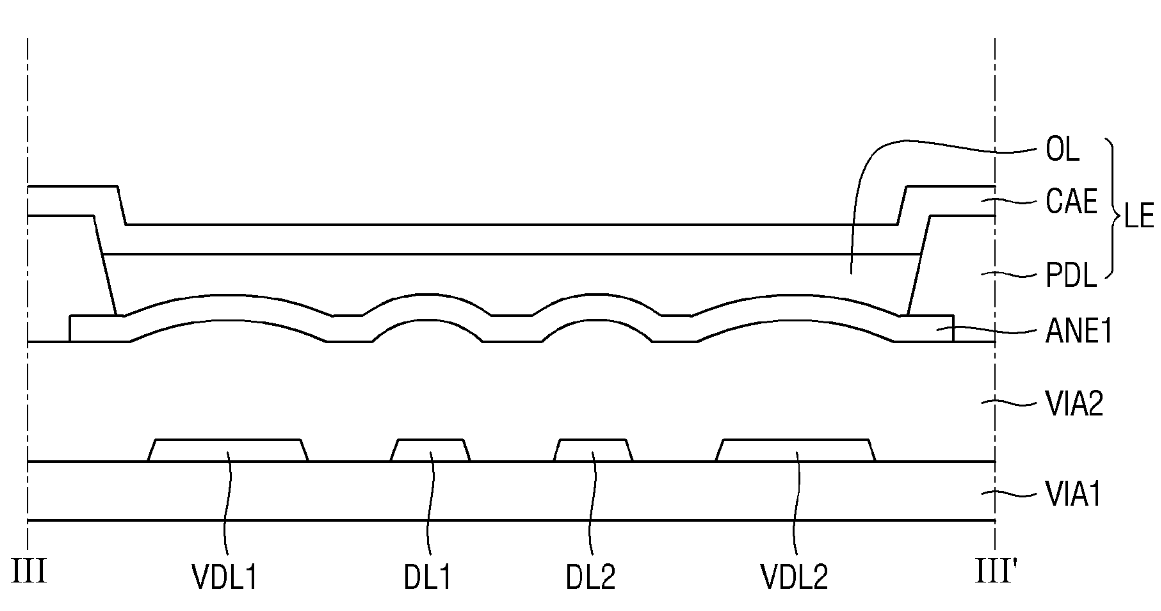
FIG. 12 is a cross-sectional view taken along line III-III' of FIG. 10.
Figure 13:
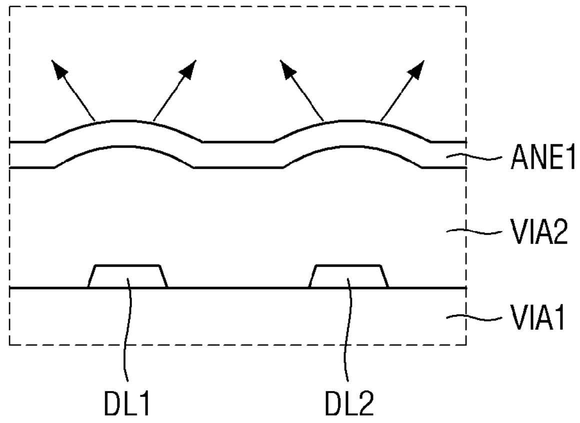
FIG. 13 is a view schematically illustrating structures of data lines and anode electrodes.
Figure 14:
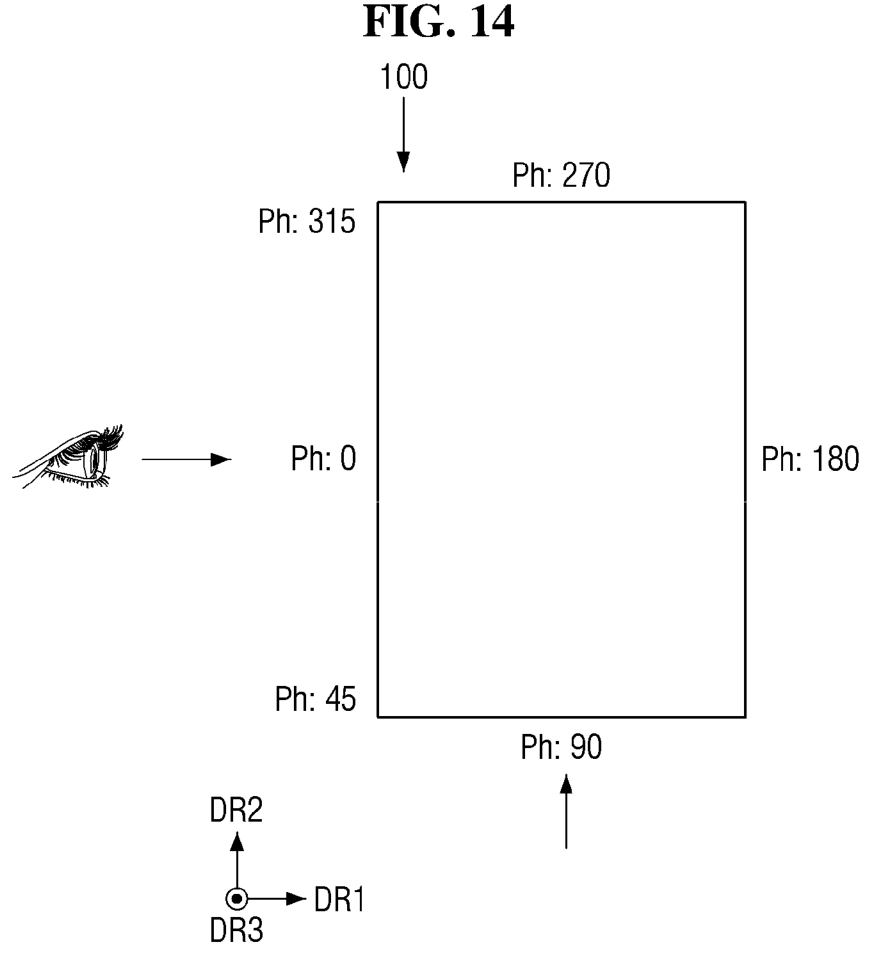
FIG. 14 is a view schematically illustrating azimuth at which a user views a display panel.
Figure 15:
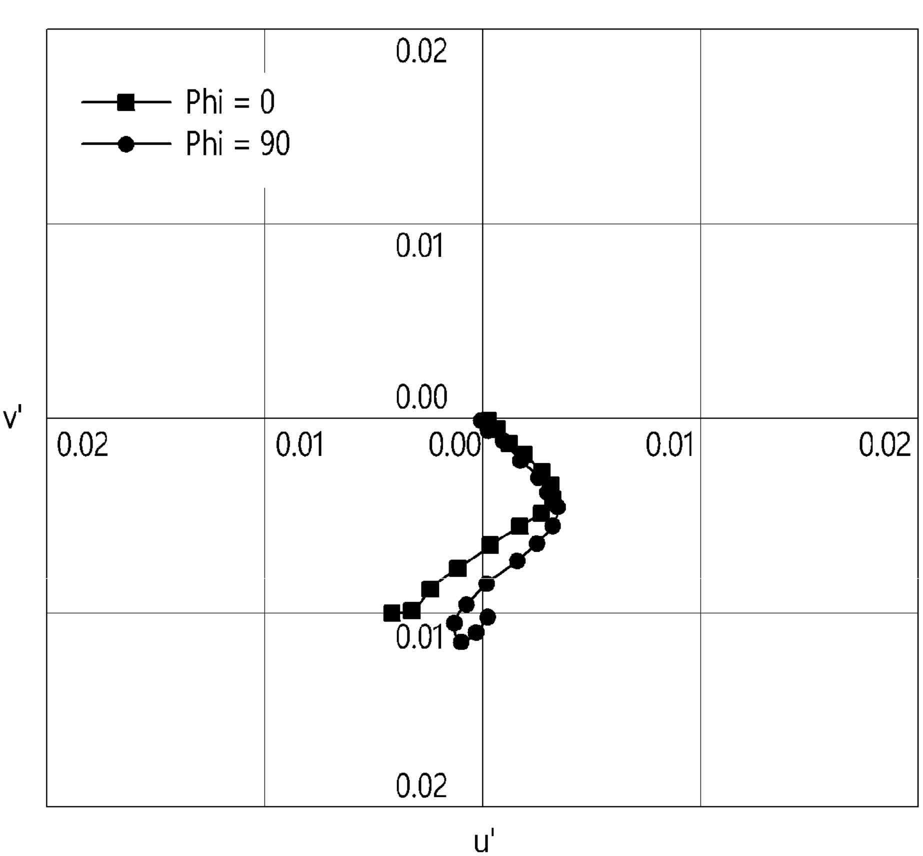
FIG. 15 is a graph illustrating color coordinates according to azimuths at which the user watches the display panel.

FIG. 10 is a plan view illustrating a second data layer and anode electrodes of sub-pixels according to an embodiment. FIG. 11 is a plan view illustrating the data lines of FIG. 10. FIG. 12 is a cross-sectional view taken along line III-III' of FIG. 10. FIG. 13 is a view schematically illustrating structures of data lines and anode electrodes. FIG. 14 is a view schematically illustrating azimuths at which a user watches a display panel. FIG. 15 is a graph illustrating color coordinates according to azimuths at which the user watches the display panel. In FIG. 15, u' and v' represent color coordinate values in the CIE 1976 color coordinate system Referring to FIGS. 10 to 15, in the display panel 100, the second data layer DTL2 may be disposed in the display area DA. The second data layer DTL2 may be disposed on the first via layer VIAL and may include a plurality of first data lines DL1, a plurality of second data lines DL2, and a plurality of high-level voltage lines VDL including a first high-level voltage line VDL1 and a second high-level voltage line VDL2.

The first data lines DL1 may be extended in the second direction DR2 and may be spaced apart from one another in the first direction DR1. The first data lines DL1 may be spaced apart from one another with the second data lines DL2 and the high-level voltage lines VDL interposed therebetween. The first data lines DL1 may be disposed between two adjacent high-level lines VDL and spaced apart from the high-level voltage lines VDL when viewed from the top. For example, a first data line DL1 may be disposed between a high-level voltage line VDL and a second data lines DL2.

The second data lines DL2 may be extended in the second direction DR2 and may be spaced apart from one another in the first direction DR1. The second data lines DL2 may be spaced apart from one another with the first data lines DL1 and the high-level voltage lines VDL interposed therebetween. The second data lines DL1 may be disposed between two adjacent high-level lines VDL and spaced apart from the high-level voltage lines VDL when viewed from the top. For example, a second data line DL2 may be disposed between a high-level voltage line VDL and a first data lines DL1. In addition, the second data lines DL2 may be arranged generally parallel to the first data lines DL1.

The high-level voltage lines VDL may be extended in the second direction DR2 and may be spaced apart from one another in the first direction DR1. The high-level voltage lines VDL may be spaced apart from one another with the first data lines DL1 and the second data lines DL2 interposed therebetween. The high-level voltage lines VDL may be disposed between adjacent first data lines DL1 or the second data lines DL2 and spaced apart from them when viewed from the top. For example, the high-level voltage lines VDL may be disposed between the first data lines DL1 and the second data lines DL2. In addition, the high-level voltage lines VDL may be generally parallel to the first data lines DL1 and the second data lines DL2.

A plurality of anode electrodes ANE1, ANE2 and ANE3 may be disposed above the second data layer DTL2. The anode electrodes ANE1, ANE2 and ANE3 may be disposed on the second via layer VIA2 covering the second data layer DTL2 and may be spaced apart from one another. The plurality of anode electrodes ANE1, ANE2 and ANE3 may include a first anode electrode ANE1, a second anode electrode ANE2, and a third anode electrode ANE3.

The first anode electrode ANE1 may be disposed between the first high-level voltage line VDL1 and the second high-level voltage line VDL2. The first anode electrode ANE1 may overlap the first high-level voltage line VDL1 and the second high-level voltage line VDL2. In addition, the first anode electrode ANE1 may overlap the first data line DL1 and the second data line DL2 disposed between the first high-level voltage line VDL1 and the second high-level voltage line VDL2. The first anode electrode ANE1 may be connected to a pixel circuit through a first anode hole ANH1 in a region partitioned by the first high-level voltage line VDL1. For example, it may be connected to the driving transistor DT of the pixel circuit.

The second anode electrode ANE2 may be spaced apart from the first anode electrode ANE1 in the second direction DR2. The second anode electrode ANE2 may be disposed between the first high-level voltage line VDL1 and the second high-level voltage line VDL2. Although not shown herein, the second anode electrode ANE2 may overlap the first high-level voltage line VDL1 and the second high-level voltage line VDL2. In addition, the second anode electrode ANE2 may overlap the first data line DL1 and the second data line DL2 disposed between the first high-level voltage line VDL1 and the second high-level voltage line VDL2. The second anode electrode ANE2 may be connected to the driving transistor DT of the pixel circuit through a second anode hole ANH2 in the region partitioned by the first high-level voltage line VDL1.

The third anode electrode ANE3 may be spaced apart from the first anode electrode ANE1 in a diagonal direction DD1 between the first and second directions DR1 and DR2. Although not shown herein, the third anode electrode ANE3 may overlap the second high-level voltage line VDL2. In addition, the third anode electrode ANE3 may not overlap the first data line DL1 or the second data line DL2. The third anode electrode ANE3 may be connected to the driving transistor DT of the pixel circuit through a third anode hole ANH3 in a region partitioned by the second high-level voltage line VDL2.

A plurality of emission areas EMA1, EMA2 and EMA3 separated by the pixel-defining film PDL may be located on the respective anode electrodes ANE1, ANE2 and ANE3. For example, the first emission area EMA1 may be located on the first anode electrode ANE1, the second emission area EMA2 may be located on the second anode electrode ANE2, and the third emission area EMA3 may be located on the third anode electrode ANE3.

The emission areas EMA1, EMA2 and EMA3 may emit lights of different colors. For example, the first emission area EMA1 may emit blue light, the second emission area EMA2 may emit red light, and the third emission area EMA3 may emit green light. It is, however, to be understood that the present disclosure is not limited thereto. In addition, the emission areas EMA1, EMA2 and EMA3 may have different sizes. Herein, the size may be the area when viewed from the top. For example, the size of the first emission area EMA1 may be larger than the sizes of the second emission area EMA2 and the third emission area EMA3. The size of the second emission area EMA2 may be smaller than the size of the first emission area EMA1 and larger than the size of the third emission area EMA3. The size of the third emission area EMA3 may be smaller than the sizes of the first emission area EMA1 and the second emission area EMA2. It is, however, to be understood that the present disclosure is not limited thereto.

In order for the emission areas EMA1, EMA2 and EMA3 to have different sizes, the anode electrodes ANE1, ANE2 and ANE3 may also have different sizes. For example, the size of the first anode electrode ANE1 may be larger than the sizes of the second anode electrode ANE2 and the third anode electrode ANE3. The size of the second anode electrode ANE2 may be smaller than the size of the first anode electrode ANE1 and larger than the size of the third anode electrode ANE3. The size of the third anode electrode ANE3 may be smaller than the sizes of the first anode electrode ANE1 and the second anode electrode ANE2. It is, however, to be understood that the present disclosure is not limited thereto.

The first emission area EMA1 and the second emission area EMA2 may be disposed to overlap the first data line DL1 and the second data line DL2. That is, the first data line DL1 and the second data line DL2 are disposed under the first emission area EMA1 and the second emission area EMA2, and the first data line DL1 and the second data line DL2 may pass in the second direction DR2. The first anode electrode ANE1 is disposed under the first emission area EMA1, and the second anode electrode ANE2 is disposed under the second emission area EMA2. Since the first anode electrode ANE1 and the second anode electrode ANE2 are disposed on the underlying layer, for example, the surface of the second via layer VIA2, they reflect the surface profile of the second via layer VIA2. For example, if there are elevations on the surface of the second via layer VIA2, the elevations are also formed in the first anode electrode ANE1 or the second anode electrode ANE2.

As shown in FIG. 13, the first data line DL1 and the second data line DL2 are disposed under the second via layer VIA2, and there may be elevations on the surface of the second via layer VIA2 due to the steps created by thickness of the first data line DL1 and the second data line DL2. When this happens, lights emitted from the organic light-emitting layer are reflected off the inclined surfaces of the first anode electrode ANE1 at different angles.

As shown in FIGS. 14 and 15, the color coordinate values when a user watches the display panel in the direction perpendicular to the second direction DR2 in which the first and second data lines DL1 and DL2 are extended, e.g., in the azimuth (phi) of zero degree may be different from the color coordinate values when the user watches the display panel in the second direction DR2, e.g., in the azimuth (phi) of ninety degrees. That is to say, the white angular dependency (WAD) may occur, i.e., the color coordinates may appear differently.

According to the embodiment, it is possible to improve the WAD issue by way of adjusting the shapes of the first data line DL1 and the second data line DL2 overlapping with the first and second emission areas EMA1 and EMA2.

Referring to FIGS. 10 and 11, each of the first data line DL1 and the second data line DL2 may have a curved shape. The first data line DL1 and the second data line DL2 may include straight portions VLP1 and VLP2, curved portions CLP1 and CLP2, and connection portions CCP1 and CLP2.

Specifically, the first data line DL1 may include a first straight portion VLP1, a first curved portion CLP1 connected to the first straight portion VLP1, and a first connection portion connecting the first curved portions CLP1 with another curved portion CCP1.

The first straight portion VLP1 may refer to a region where the first data line DL1 is extended in a straight line without bending. The first straight portion VLP1 may be extended in the second direction DR2 in which the first data line DL1 is extended. The first straight portion VLP1 may overlap the first and second anode electrodes ANE1 and ANE2 and may overlap the first and second emission areas EMA1 and EMA2.

The first curved portion CLP1 may not be extended in a straight line with the first straight portion VLP1 or the first connection portion CCP1 but may be bent with a curvature. The first curved portion CLP1 may have a curvature that protrudes away from the second data line DL2. The first curved portion CLP1 may include a first protrusion portion PRP1 and a first groove portion GRP1 formed by the first curved portion CLP1 when viewed from the top. The first protrusion portion PRP1 may protrude away from the second data line DL2. For example, the first protrusion portion PRP1 may protrude toward the first high-level voltage line VDL1. The first groove portion GRP1 may be concave away from the second data line DL2. For example, the first groove portion GRP1 may be concave toward the first high-level voltage line VDL1. The first groove portion GRP1 may have a semicircular shape when viewed from the top.

The first connection portion CCP1 may be disposed to connect between adjacent first curved portions CLP1 of the first data line DL1. The first connection portion CCP1 may be extended in the same direction as the first straight portion VLP1 on the same line. The first connection portion CCP1 may be identical to the first straight portion VLP1 except that the former is disposed between the first curved portions CLP1.

The second data line DL2 may include a second straight portion VLP2, a second curved portion CLP2 connected to the second straight portion VLP2, and a second connection portion CCP2 connecting the second curved portion CLP2 with another one.

The second straight portion VLP2 may refer to a region where the second data line DL2 is extended in a straight line without bending. The second straight portion VLP2 may be extended in the second direction DR2 in which the second data line DL2 is extended.

The second curved portion CLP2 may not be extended in a straight line with the second straight portion VLP2 or the second connection portion CCP2 but may be bent with a curvature. The second curved portion CLP2 may have a curvature that protrudes away from the first data line DL1. The second curved portion CLP2 may include a second protrusion portion PRP2 and a second groove portion GRP2 formed by the second curved portion CLP2 when viewed from the top. The second protrusion portion PRP2 may protrude away from the first data line DL1. For example, the second protrusion portion PRP2 may protrude toward the second high-level voltage line VDL1. The second groove portion GRP2 may be concave away from the first data line DL1. For example, the second groove portion GRP2 may be concave toward the second high-level voltage line VDL2. The second groove portion GRP2 may have a semicircular shape when viewed from the top.

The second connection portion CCP2 may be disposed to connect between adjacent second curved portions CLP2 of the second data line DL2. The second connection portion CCP2 may be extended in the same direction as the second straight portion VLP2 on the same line. The second connection portion CCP2 may be identical to the second straight portion VLP2 except that the former is disposed between the second curved portions CLP2.

The first straight portion VLP1 of the first data line DL1 may be parallel to the second straight portion VLP2 of the second data line DL2 and may face it. The first connection portion CCP1 of the first data line DL1 may be parallel to the second connection portion CCP2 of the second data line DL2. The first curved portion CLP1 of the first data line DL1 may be adjacent to the second curved portion CLP2 of the second data line DL2 in the first direction DR1.

The distance between the first straight portion VLP1 of the first data line DL1 and the second straight portion VLP2 of the second data line DL2 may be equal to the distance between the first connection portion CCP1 of the first data line DL1 and the second connection portion CCP2 of the second data line DL2. In addition, the minimum distance between the first curved portion CLP1 of the first data line DL1 and the second curved portion CLP2 of the second data line DL2 may be equal to the distance between the first straight portion VLP1 of the first data line DL1 and the second straight point VLP2 of the second data line DL2. The maximum distance between the first curved portion CLP1 of the first data line DL1 and the second curved portion CLP2 of the second data line DL2 may be greater than the distance between the first straight portion VLP1 of the first data line DL1 and the second straight portion VLP2 of the second data line DL2 or the distance between the first connection portion CCP1 of the first data line DL1 and the second connection portion CCP2 of the second data line DL2.

In addition, the distance between the first curved portion CLP1 of the first data line DL1 and the second curved portion CLP2 of the second data line DL2 may be variable. For example, the distance between the first curved portion CLP1 of the first data line DL1 and the second curved portion CLP2 of the second data line DL2 may increase gradually in the second direction DR2 and then may decrease gradually.

The shape of the first data line DL1 and the shape of the second data line DL2 may be symmetrical to each other. For example, the shapes of the first data line DL1 and the second data line DL2 may be symmetrical with respect to a line LL extended in the second direction DR2 in which the first data line DL1 and the second data line DL2 are extended.

The first straight portion VLP1, the first curved portion CLP1 and the first connection portion CCP1 of the first data line DL1 described above may overlap the first and second anode electrodes ANE1 and ANE2 and the first and second emission areas EMA1 and EMA2. In addition, although each of the data lines DL1 and DL2 has two curved portions where it overlaps one emission area in the example shown in FIGS. 10 and 11, the present disclosure is not limited thereto. For example, each of the data lines DL1 and DL2 may have one curved portion or three or more curved portions where it overlaps the first emission area EMA1.

Figure 16:
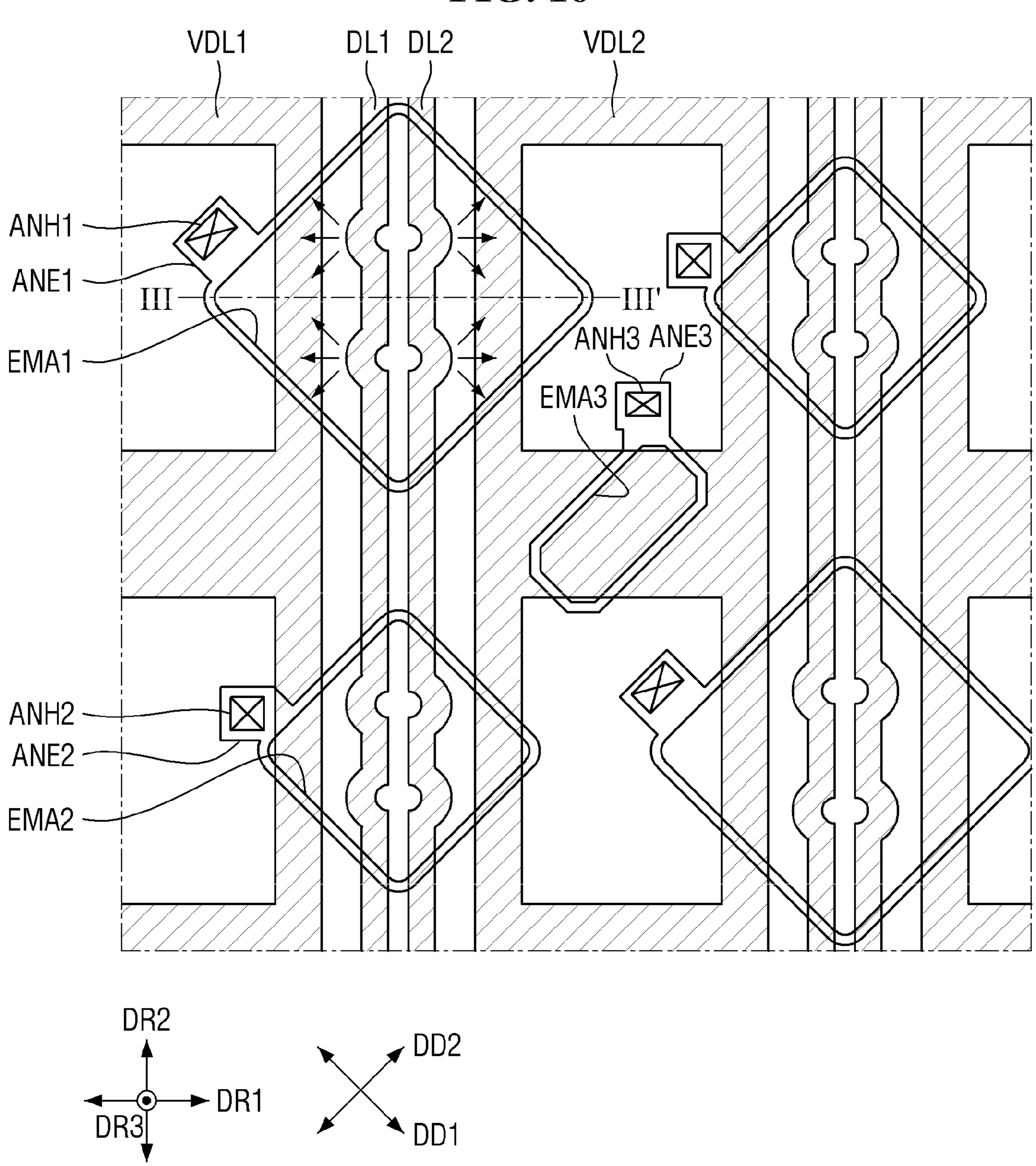
FIG. 16 is a view illustrating directions in which lights are reflected by the first anode electrode in FIG. 10.
Figure 17:
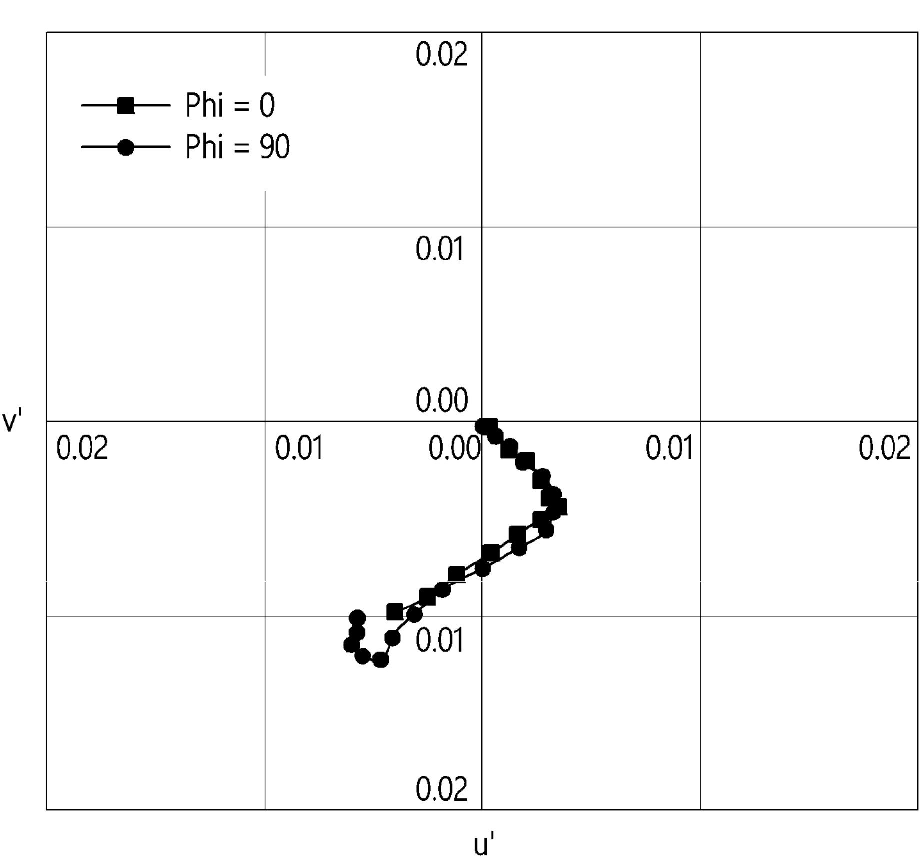
FIG. 17 is a graph illustrating color coordinates according to azimuth at which the user watches the display panel.

FIG. 16 is a view illustrating directions in which lights are reflected by the first anode electrode in FIG. 10. FIG. 17 is a graph illustrating color coordinates according to azimuth at which the user watches the display panel.

Referring to FIG. 16, if each of the first data line DL1 and the second data line DL2 has a curved shape, elevations may also formed on the first anode electrode ANE1 formed thereon. As a result, the inclined surfaces of the first anode electrode ANE1 may be formed in different directions along the curved elevations, so that lights may be reflected in different azimuths. In other words, the reflected lights by the first anode electrode ANE1 may be distributed in different directions.

As shown in FIG. 14, the reflected lights may be distributed in the azimuth (phi) of zero degree, the azimuth (phi) of 315 degrees, and the azimuth (phi) of 45 degrees on the display panel 100. In this manner, as shown in FIG. 17, it is possible to reduce a difference in color coordinate values when a user watches the display panel in the azimuth (phi) of zero degree and the azimuth (phi) of ninety degrees. In other words, it is possible to improve the WAD issue.

Figure 18:
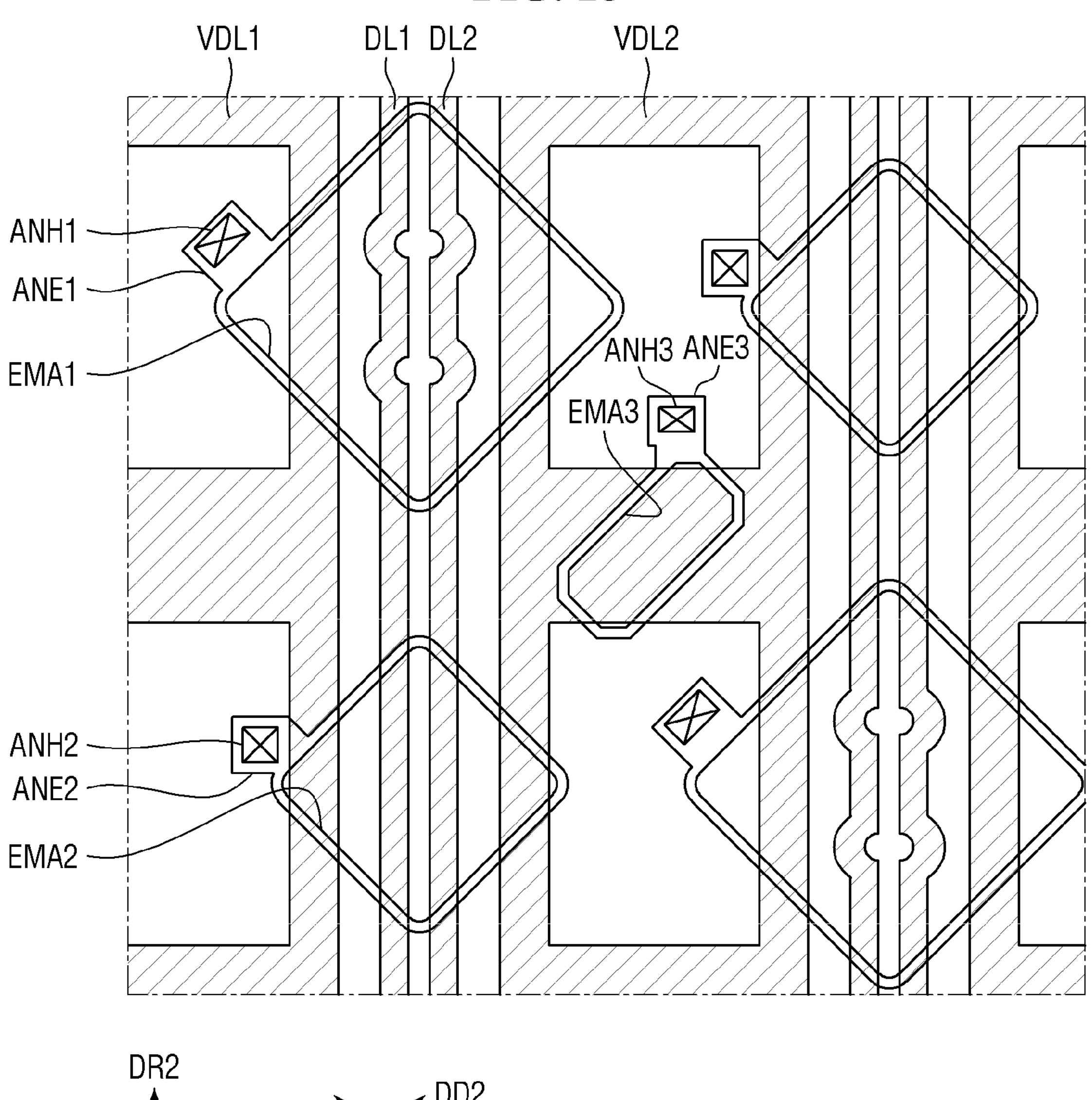
FIGS. 18 and 19 are plan views illustrating a second data layer and anode electrodes of sub-pixels according to a variety of embodiments.
Figure 19:
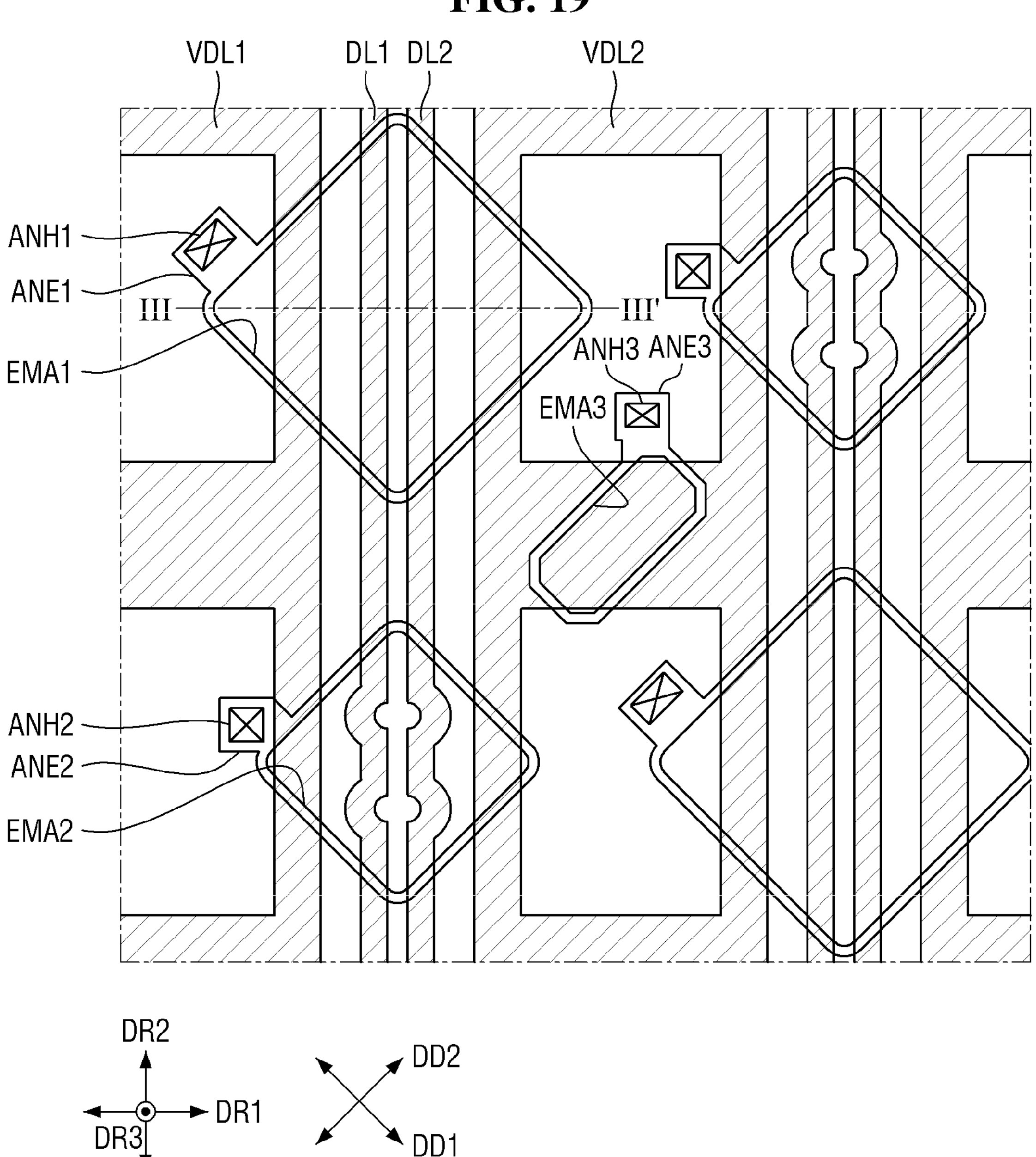

FIGS. 18 and 19 are plan views illustrating a second data layer and anode electrodes of sub-pixels according to a variety of embodiments.

Referring to FIG. 18, the above-described first data line DL1 and second data line DL2 may have a curved shape where they overlap the first emission area EMA1, and may have a straight line shape where they overlap the second emission area EMA2. For example, the first curved portion CLP1 and the first connection portion CCP1 of the first data line DL1 and the second curved portion CLP2 and the second connection portion CCP2 of the second data line DL2 may overlap the first emission area EMA1 and the first anode electrode ANE1 but not with the second emission area EMA2.

Referring to FIG. 19, the above-described first data line DL1 and second data line DL2 may have a curved shape where they overlap the second emission area EMA2, and may have a straight line shape where they overlap the first emission area EMA1. For example, the first curved portion CLP1 and the first connection portion CCP1 of the first data line DL1 and the second curved portion CLP2 and the second connection portion CCP2 of the second data line DL2 may overlap the second emission area EMA2 and the second anode electrode ANE2 but not with the first emission area EMA1.

Figure 20:
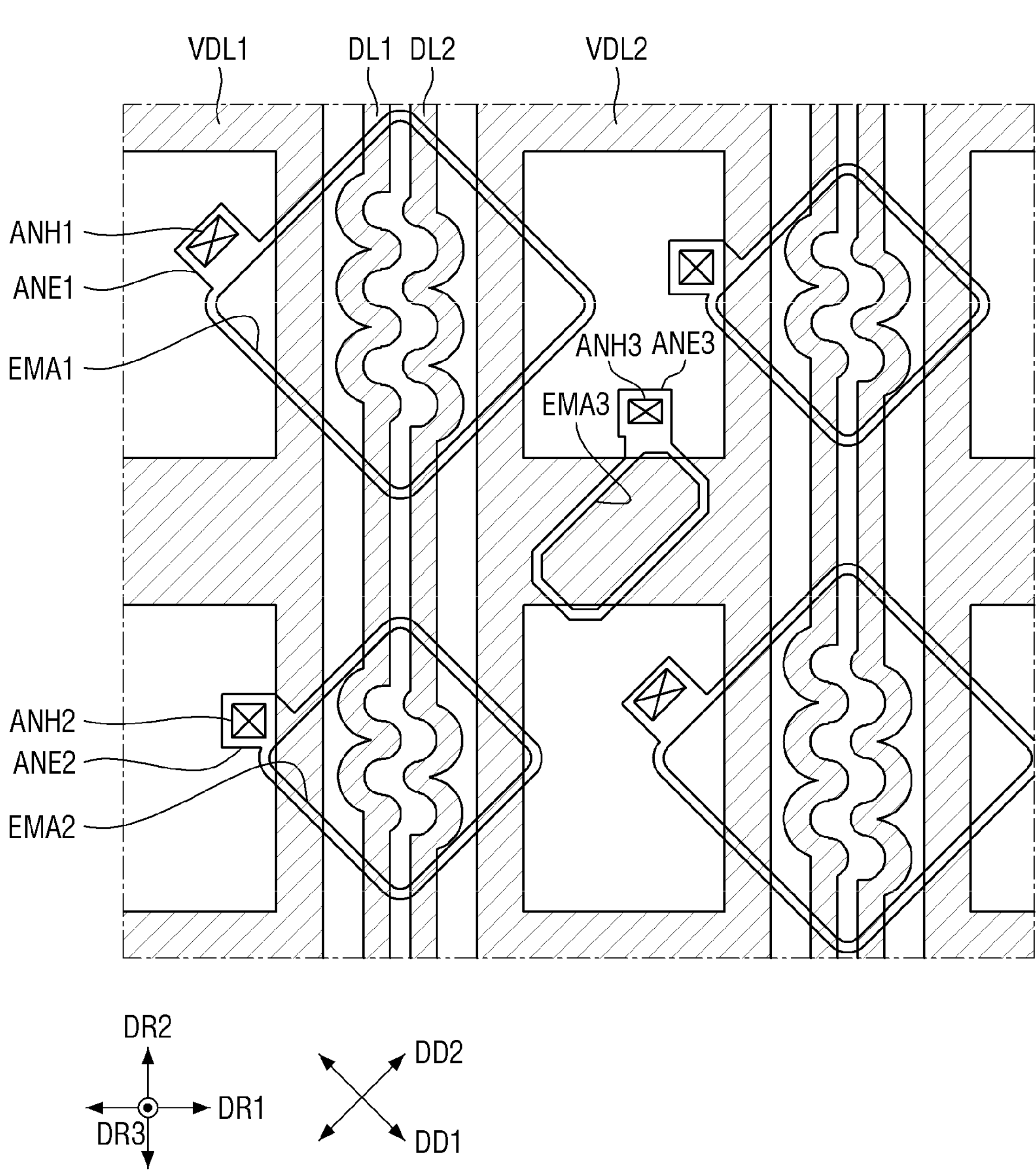
FIG. 20 is a plan view illustrating second data layers and anode electrodes of sub-pixels according to another embodiment.
Figure 21:
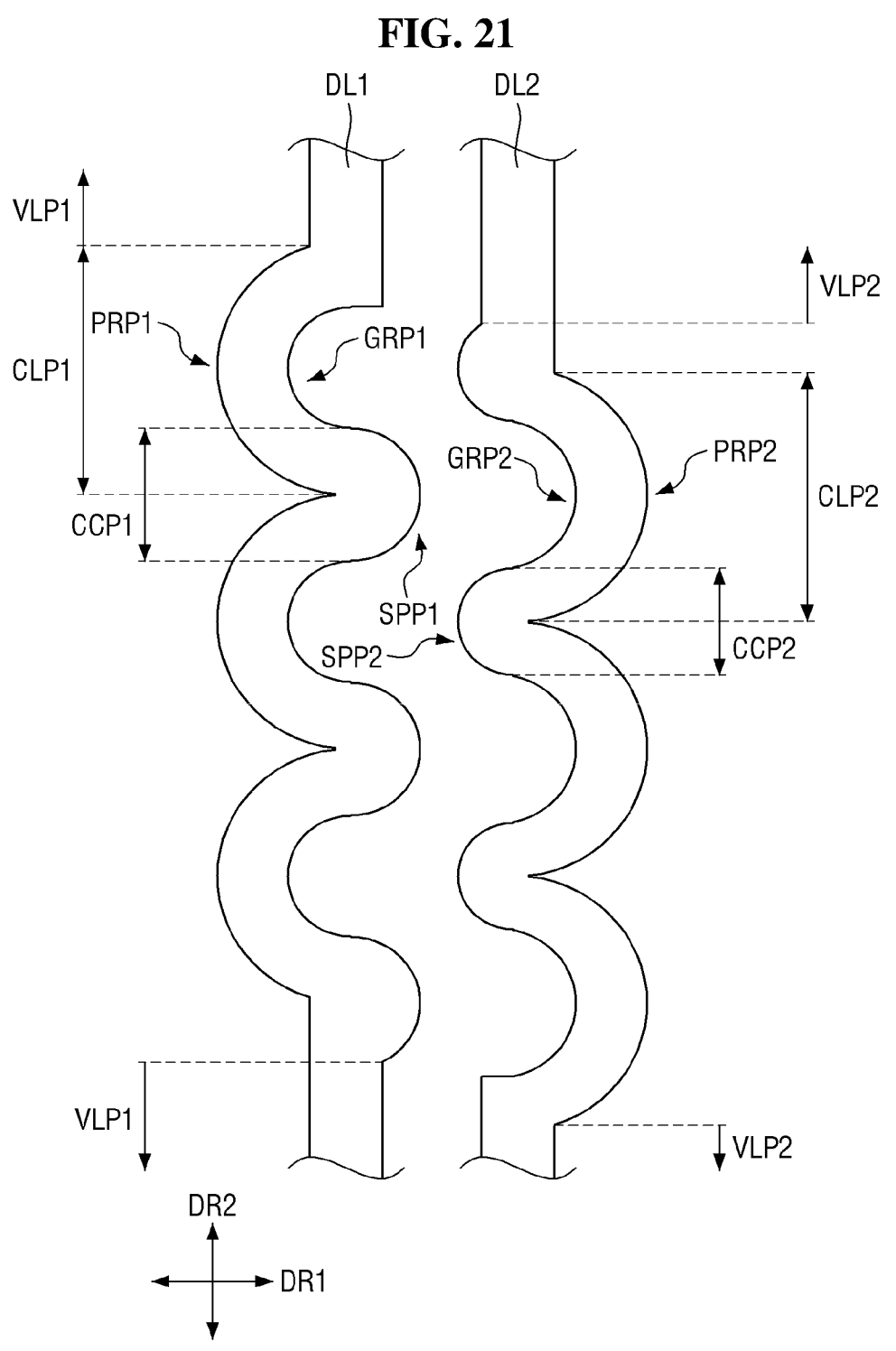

FIG. 20 is a plan view illustrating second data layers and anode electrodes of sub-pixels according to another embodiment. FIG. 21 is a plan view illustrating a first data line and a second data line according to another embodiment.

The embodiment of FIGS. 20 and 21 is substantially identical to the above-described embodiment of FIGS. 10 to 18 except for a different curved shape of the first data line DL1 and the second data line DL2, therefore, the redundant descriptions will be omitted.

Each of the first data line DL1 and the second data line DL2 may have a curved shape. The first data line DL1 and the second data line DL2 may include straight portions VLP1 and VLP2, curved portions CLP1 and CLP2, and connection portions CCP1 and CCP2.

Specifically, the first data line DL1 may include a first straight portion VLP1, a first curved portion CLP1 connected to the first straight portion VLP1, and a first connection portion where the first curved portion CLP1 is connected with another one.

The first straight portion VLP1 may refer to a region where the first data line DL1 is extended in a straight line without bending. The first straight portion VLP1 may be extended in the second direction DR2 in which the first data line DL1 is extended. The first straight portion VLP1 may overlap the first and second anode electrodes ANE1 and ANE2 and may overlap the first and second emission areas EMA1 and EMA2.

The first curved portion CLP1 may not be extended in a straight line with the first straight portion VLP1 or the first connection portion CCP1 but may be bent with a curvature. The first curved portion CLP1 may have a curvature that protrudes away from the second data line DL2. The first curved portion CLP1 may include a first protruding portion PRP1 and a first groove portion GRP1 formed by the first curved portion CLP1 when viewed from the top. The first protrusion portion PRP1 may protrude away from the second data line DL2. For example, the first protrusion portion PRP1 may protrude toward the first high-level voltage line VDL1. The first groove portion GRP1 may be concave away from the second data line DL2. For example, the first groove portion GRP1 may be concave toward the first high-level voltage line VDL1. The first groove portion GRP1 may have a semicircular shape when viewed from the top.

At the first connection portion CCP1, the first curved portion CLP1 may be connected to another one. The first connection portion CCP1 may overlap another first connection portion CPP1 and may include a first sub-protrusion portion SPP1. The first sub-protrusion portion SPP1 may protrude toward the adjacent second data line DL2. A portion of the first sub-protrusion portion SPP1 may be included in one first curved portion CLP1 disposed in the second direction DR2, and another part thereof may be included in another first curved portion CLP1 disposed on the lower side. The first sub-protrusion portion SPP1 of the first data line DL1 may protrude away from the first protrusion portion PRP1.

The second data line DL2 may include a second straight portion VLP2, a second curved portion CLP2 connected to the second straight portion VLP2, and a second connection portion CCP2 where the second curved portion CLP2 is connected with another one.

The second straight portion VLP2 may refer to a region where the second data line DL2 is extended in a straight line without bending. The second straight portion VLP2 may be extended in the second direction DR2 in which the second data line DL2 is extended.

The second curved portion CLP2 may not be extended in a straight line with the second straight portion VLP2 or the second connection portion CCP2 but may be bent with a curvature. The second curved portion CLP2 may have a curvature that protrudes away from the first data line DL1. The second curved portion CLP2 may include a second protrusion portion PRP2 and a second groove portion GRP2 formed by the second curved portion CLP2 when viewed from the top. The second protrusion portion PRP2 may protrude away from the first data line DL1. For example, the second protrusion portion PRP2 may protrude toward the second high-level voltage line VDL1. The second groove portion GRP2 may be concave away from the first data line DL1. For example, the second groove portion GRP2 may be concave toward the second high-level voltage line VDL2. The second groove portion GRP2 may have a semicircular shape when viewed from the top.

At the second connection portion CCP2, the second curved portion CLP2 may be connected to another one. The second connection portion CCP2 may overlap another second connection portion CPP2 and may include a second sub-protrusion portion SPP2. The second sub-protrusion portion SPP2 may protrude toward the adjacent first data line DL1. A portion of the second sub-protrusion portion SPP2 may be included in one second curved portion CLP2 disposed in the second direction DR2, and another part thereof may be included in another second curved portion CLP2 disposed on the lower side. The second sub-protrusion portion SPP2 of the second data line DL2 may protrude away from the second protrusion portion PRP2.

The first sub-protrusion portion SPP1 of the first data line DL1 may face the second groove portion GRP2 of the second data line DL2. For example, the first sub-protrusion portion SPP1 may overlap the second groove portion GRP2 in the first direction DR1. In addition, the second sub-protrusion portion SPP2 of the second data line DL2 may face the first groove portion GRP1 of the first data line DL1. For example, the second sub-protrusion portion SPP2 may overlap the first groove portion GRP1 in the first direction DR1. The first sub-protrusion portion SPP1 of the first data line DL1 may overlap the second curved portion CLP2 of the second data line DL2 in the first direction DR1. The second sub-protrusion portion SPP2 of the second data line DL2 may overlap the first curved portion CLP1 of the first data line DL1 in the first direction DR1. The first sub-protrusion portion SPP1 of the first data line DL1 may overlap the second sub-protrusion portion SPP2 of the second data line DL2 in the first direction DR1.

The distance between the first straight portion VLP1 of the first data line DL1 and the second straight portion VLP2 of the second data line DL2 may be constant. In addition, the maximum distance between the first curved portion CLP1 of the first data line DL1 and the second curved portion CLP2 of the second data line DL2 may be greater than the distance between the first straight portion VLP1 of the first data line DL1 and the second straight point VLP2 of the second data line DL2. In addition, the distance between the first curved portion CLP1 of the first data line DL1 and the second curved portion CLP2 of the second data line DL2 may be variable. For example, the distance between the first curved portion CLP1 of the first data line DL1 and the second curved portion CLP2 of the second data line DL2 may increase gradually in the second direction DR2 and then may decrease gradually.

The shape of the first data line DL1 and the shape of the second data line DL2 may be asymmetrical to each other. For example, the first data line DL1 and the second data line DL2 may be in such a shape that they are engaged with each other. The shape formed by the gaps between the first data line DL1 and the second data line DL2 in the second direction DR2 may be an S-shape.

The first straight portion VLP1, the first curved portion CLP1 and the first connection portion CCP1 of the first data line DL1 described above may overlap the first and second anode electrodes ANE1 and ANE2 and the first and second emission areas EMA1 and EMA2. In addition, although each of the data lines DL1 and DL2 has through curved portions where it overlaps one emission area in the example shown in FIGS. 20 and 21, the present disclosure is not limited thereto. For example, each of the data lines DL1 and DL2 may have two or one curved portion or four or more curved portions where it overlaps the first emission area EMA1.

In addition, in the example shown in FIGS. 20 and 21 described above, the first and second data lines DL1 and DL2 have a curved shape where they overlap the first and second emission areas EMA1 and EMA2. It should be understood, however, that the present disclosure is not limited thereto. As shown in FIG. 18, the first and second data lines DL1 and DL2 may have a curved shape where they overlap the first emission area EMA1, and may have a straight line shape where they overlap the second emission area EMA2. In addition, as described above with reference to FIG. 19, the first data line DL1 and second data line DL2 may have the curved shape where they overlap the second emission area EMA2, and may have the straight line shape where they overlap the first emission area EMA1.

Figure 22:
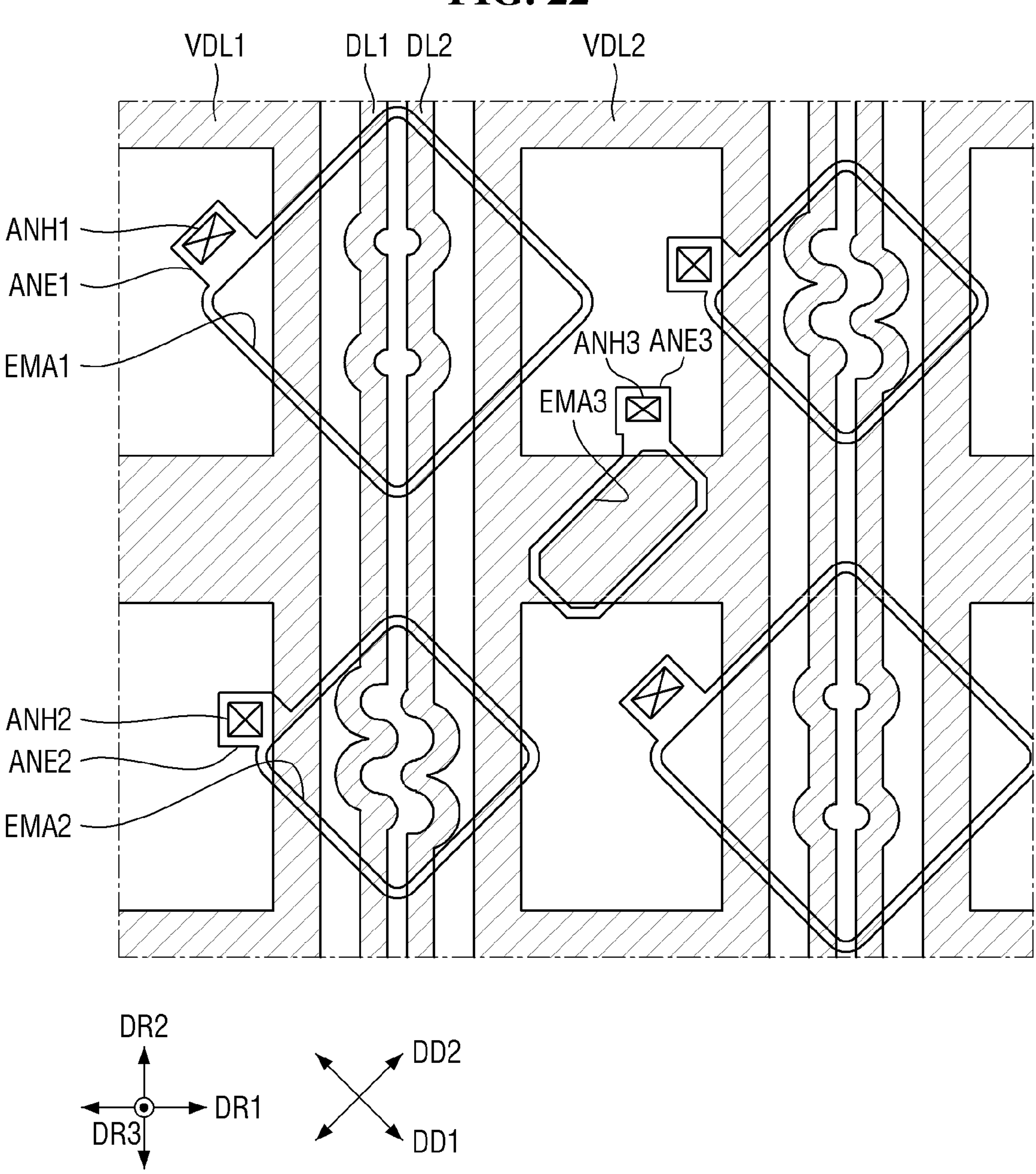
FIG. 22 is a plan view illustrating second data layers and anode electrodes of sub-pixels according to yet another embodiment.

FIG. 22 is a plan view illustrating second data layers and anode electrodes of sub-pixels according to yet another embodiment.

Referring to FIG. 22, the above-described first data line DL1 and second data line DL2 may have the curved shape shown in FIG. 11 where they overlap the first emission area EMA1, and may have the curved shape shown in FIG. 21 where they overlap the second emission area EMA2.

For example, the first sub-protrusion portion SPP1 of the first data line DL1 may not overlap the first emission area EMA1 and may overlap the second emission area EMA2. In addition, the second sub-protrusion portion SPP2 of the second data line DL2 may not overlap the first emission area EMA1 and may overlap the second emission area EMA2.

A variety of shapes of the data lines disclosed in the drawings may be applied to the above embodiments by changing the arrangement in the emission areas.

In concluding the detailed description, those skilled in the art will appreciate that many variations and modifications can be made to the preferred embodiments without substantially departing from the principles of the present disclosure. Therefore, the disclosed preferred embodiments of the disclosure are used in a generic and descriptive sense only and not for purposes of limitation.

What is claimed is:

1. A display device comprising:

a substrate;

a first data line and a second data line disposed on the substrate and extended in a first direction;

an anode electrode disposed on the first data line and the second data line;

a pixel-defining film disposed on the anode electrode and defining an emission area;

an organic light-emitting layer disposed on the anode electrode; and a cathode electrode disposed on the organic light-emitting layer, wherein each of the first data line and the second data line has a curved shape when viewed from a top where the first data line and the second data line overlap the anode electrode, wherein the first data line includes a first straight portion, a first curved portion connected to the first straight portion, and a first connection portion connected to the first curved portion, wherein the second data line includes a second straight portion, a second curved portion connected to the second straight portion, and a second connection portion connected to the second curved portion, and wherein the first straight portion, the first connection portion, the second straight portion and the second connection portion are extended in the first direction and are formed as straight lines.

2. The display device of claim 1, wherein the first data line and the second data line are disposed adjacent to each other and are symmetrical to each other in the first direction.

3. The display device of claim 1, wherein the first straight portion and the second straight portion face each other and are arranged in parallel, and wherein the first connection portion and the second connection portion face each other and are arranged in parallel.

4. The display device of claim 1, wherein the first curved portion has a curvature protruding away from the second data line, and wherein the second curved portion has a curvature protruding away from the first data line.

5. The display device of claim 1, wherein the first curved portion includes a first protrusion portion protruding away the second data line, and a first groove portion concave away from the second data line, and wherein the second curved portion includes a second protrusion portion protruding away the first data line, and a second groove portion concave away from the first data line.

6. The display device of claim 5, wherein the first groove portion and the second groove portion face each other and overlap each other in a second direction crossing the first direction when viewed from the top.

7. The display device of claim 1, wherein a distance between the first straight portion and second straight portion is equal to a distance between the first connection portion and second connection portion.

8. The display device of claim 1, wherein a minimum distance between the first curved portion and the second curved portion is equal to a distance between the first straight portion and the second straight portion, and wherein a maximum distance between the first curved portion and the second curved portion is greater than the distance between the first straight portion and the second straight portion.

9. The display device of claim 1, wherein a distance between the first curved portion and the second curved portion is variable.

10. A display device comprising:

a substrate;

a first data line and a second data line disposed on the substrate and extended in a first direction;

an anode electrode disposed on the first data line and the second data line;

a pixel-defining film disposed over the anode electrode and defining an emission area;

an organic light-emitting layer disposed on the anode electrode; and a cathode electrode disposed on the organic light-emitting layer, wherein a distance between the first data line and the second data line is variable where the first data line and the second data line overlap the emission area, wherein the first data line includes a first straight portion, a first curved portion connected to the first straight portion, and a first connection portion connected to the first curved portion, wherein the second data line includes a second straight portion, a second curved portion connected to the second straight portion, and a second connection portion connected to the second curved portion, and wherein the first straight portion, the first connection portion, the second straight portion and the second connection portion are extended in the first direction and are formed as straight lines.

11. The display device of claim 10, wherein the first curved portion and the second connection portion overlap each other in a second direction crossing the first direction when viewed from a top, and wherein the second curved portion and the first connection portion overlap each other in the second direction when viewed from the top.

12. The display device of claim 10, wherein the first connection portion comprises a first sub-protrusion portion that protrudes toward the second data line, wherein the second connection portion comprises a second sub-protrusion portion that protrudes toward the first data line, and wherein the first sub-protrusion portion and the second sub-protrusion portion do not overlap each other in a second direction crossing the first direction when viewed from a top.

13. The display device of claim 10, wherein the first curved portion has a curvature protruding away from the second data line, and wherein the second curved portion has a curvature protruding away from the first data line.

14. The display device of claim 10, wherein a distance between the first curved portion and the second curved portion gradually increases and then gradually decreases in the first direction.

15. A display device comprising:

a substrate;

a first data line and a second data line disposed on the substrate and extended in a first direction;

a first anode electrode and a second anode electrode disposed on the first data line and the second data line;

a pixel-defining film disposed over the first anode electrode and the second anode electrode and defining a first emission area and a second emission area;

an organic light-emitting layer disposed on the first anode electrode and the second anode electrode; and a cathode electrode disposed on the organic light-emitting layer, wherein each of the first data line and the second data line has a curved shape when viewed from a top where the first data line and the second data line overlap at least one of the first emission area and the second emission area, wherein the first data line includes a first straight portion, a first curved portion connected to the first straight portion, and a first connection portion connected to the first curved portion, wherein the second data line includes a second straight portion, a second curved portion connected to the second straight portion, and a second connection portion connected to the second curved portion, and wherein the first straight portion, the first connection portion, the second straight portion and the second connection portion are extended in the first direction and are formed as straight lines.

16. The display device of claim 15, wherein the first emission area emits different light from the second emission area, and a size of the first emission area is greater than a size of the second emission area.

17. The display device of claim 15, wherein the first emission area emits blue light and the second emission area emits red light.

18. The display device of claim 15, wherein the first anode electrode and the second anode electrode have elevations formed where the first anode electrode and the second anode electrode overlap the first data line and the second data line.

* * * * *